US011323134B2

(12) United States Patent
Xu

(10) Patent No.: US 11,323,134 B2
(45) **Date of Patent: *May 3, 2022**

(54) ENCODING METHOD AND DEVICE AND DECODING METHOD AND DEVICE FOR STRUCTURED LDPC

(71) Applicant: XI'AN ZHONGXING NEW SOFTWARE CO., LTD., Shaanxi (CN)

(72) Inventor: Jun Xu, Shenzhen (CN)

(73) Assignee: XI'AN ZHONGXING NEW SOFTWARE CO., LTD., Shaanxi (CN)

( * ) Notice: Subject to any disclaimer, the term of this patent is extended or adjusted under 35 U.S.C. 154(b) by 0 days.

This patent is subject to a terminal disclaimer.

(21) Appl. No.: 17/110,832

(22) Filed: Dec. 3, 2020

(65) Prior Publication Data

US 2021/0091790 A1 Mar. 25, 2021

Related U.S. Application Data

(63) Continuation of application No. 16/301,290, filed as application No. PCT/CN2017/070488 on Jan. 6, 2017, now Pat. No. 10,892,778.

(30) Foreign Application Priority Data

May 13, 2016 (CN) ......................... 201610319410.1
Oct. 10, 2016 (CN) ......................... 201610884876.6

(51) Int. Cl.
*H03M 13/11* (2006.01)
*H03M 13/00* (2006.01)

(52) U.S. Cl.
CPC ..... *H03M 13/1148* (2013.01); *H03M 13/616* (2013.01)

(58) Field of Classification Search
CPC ........................ H03M 13/1148; H03M 13/616
See application file for complete search history.

(56) References Cited

U.S. PATENT DOCUMENTS 8,185,797 B2 5/2012 Jun et al.
2009/0259915 A1* 10/2009 Livshitz ............ H03M 13/1185 714/758

(Continued)

OTHER PUBLICATIONS

Japanese Office Action, for Japanese Application 2018-560038, dated Jan. 28, 2021. pp. 1-5.

(Continued)

*Primary Examiner* — Kyle Vallecillo
(74) *Attorney, Agent, or Firm* — Bond Schoeneck & King, PLLC; George McGuire

(57) ABSTRACT

Provided is an encoding method and device and a decoding method and device for structured LDPC. The encoding method includes: determining a base matrix used for encoding and performing an LDPC encoding operation on a source information bit sequence according to the base matrix and an expansion factor Z corresponding to the base matrix to obtain a codeword sequence, where Z is a positive integer. The base matrix includes multiple submatrices and the submatrices include an upper-left submatrix Hb1 and an upper-left submatrix Hb2, and the upper-left submatrix Hb1 is an upper-left submatrix of the upper-left submatrix Hb2.

18 Claims, 5 Drawing Sheets

Memory
201
Information bits
Processor
Codeword bits
202

(56) References Cited

U.S. PATENT DOCUMENTS

2010/0077275 A1* 3/2010 Yu ........................ H03M 13/116
714/752
2010/0281332 A1* 11/2010 Xu ......................... H03M 13/11
714/752
2011/0083052 A1* 4/2011 Lau ...................... H03M 13/116
714/752
2012/0240001 A1* 9/2012 Abu-Surra ........ H03M 13/6516
714/752

OTHER PUBLICATIONS

Korean Office Action, for application 10-2021-7007507, pp. 1-3, dated Jul. 17, 2021.
Error Correction Coding, Mathematical Methods and Algorithms, pp. 669-671. Todd K. Moon.
3GPP TSG-RAN WG1 #84b Apr. 11-15, 2016 Buan, Korea Qualcomm Incorporated, LDPC Codes_HARQ, rate pp. 1-4.
European Office Action, dated Sep. 16, 2021, pp. 1-7.

* cited by examiner

Kb

| | 0 | 0 | 0 | 0 | 0 | 0 | 0 | 0 | 0 | -1 | -1 | -1 | -1 | -1 | -1 | -1 | -1 | -1 | -1 | -1 | -1 | -1 | -1 | -1 |
|---|---|---|---|---|---|---|---|---|---|---|---|---|---|---|---|---|---|---|---|---|---|---|---|---|
| Hb1 | 166 | 235 | 35 | 150 | 136 | 269 | 62 | 204 | 108 | 0 | -1 | -1 | -1 | -1 | -1 | -1 | -1 | -1 | -1 | -1 | -1 | -1 | -1 | -1 |
| | 200 | 92 | 80 | 231 | 283 | 130 | 25 | 187 | -1 | 207 | 0 | -1 | -1 | -1 | -1 | -1 | -1 | -1 | -1 | -1 | -1 | -1 | -1 | -1 |
| | 0 | 153 | 105 | 199 | 164 | 144 | 162 | 69 | -1 | -1 | 116 | 0 | -1 | -1 | -1 | -1 | -1 | -1 | -1 | -1 | -1 | -1 | -1 | -1 |
| | 14 | 329 | 219 | -1 | 223 | -1 | 133 | -1 | -1 | -1 | -1 | 0 | 0 | -1 | -1 | -1 | -1 | -1 | -1 | -1 | -1 | -1 | -1 | -1 |
| Hb2 | 245 | 100 | 17 | -1 | -1 | 321 | -1 | -1 | -1 | -1 | -1 | -1 | -1 | 0 | -1 | -1 | -1 | -1 | -1 | -1 | -1 | -1 | -1 | -1 |
| | 278 | 181 | -1 | 33 | -1 | 88 | -1 | -1 | -1 | -1 | -1 | -1 | -1 | -1 | 0 | -1 | -1 | -1 | -1 | -1 | -1 | -1 | -1 | -1 |
| | 28 | 9 | -1 | 292 | 322 | -1 | 329 | -1 | -1 | -1 | -1 | -1 | -1 | -1 | -1 | 0 | -1 | -1 | -1 | -1 | -1 | -1 | -1 | -1 |
| | 102 | 243 | -1 | -1 | -1 | 26 | -1 | -1 | 121 | -1 | -1 | -1 | -1 | -1 | -1 | -1 | 0 | -1 | -1 | -1 | -1 | -1 | -1 | -1 |
| | 270 | 168 | -1 | -1 | -1 | -1 | 88 | -1 | -1 | 271 | -1 | -1 | -1 | -1 | -1 | -1 | -1 | 0 | -1 | -1 | -1 | -1 | -1 | -1 |
| Hb3 | 239 | 178 | 67 | -1 | -1 | -1 | -1 | 284 | -1 | -1 | 92 | -1 | -1 | -1 | -1 | -1 | -1 | -1 | 0 | -1 | -1 | -1 | -1 | -1 |
| | 106 | 133 | -1 | 32 | -1 | -1 | -1 | -1 | -1 | -1 | -1 | -1 | -1 | -1 | -1 | -1 | -1 | -1 | -1 | 0 | -1 | -1 | -1 | -1 |
| | 2 | 130 | -1 | -1 | 257 | -1 | 316 | -1 | -1 | -1 | -1 | -1 | -1 | -1 | -1 | -1 | -1 | -1 | -1 | -1 | 0 | -1 | -1 | -1 |
| | 292 | 85 | -1 | -1 | -1 | 300 | -1 | 251 | -1 | -1 | -1 | -1 | -1 | -1 | -1 | -1 | -1 | -1 | -1 | -1 | -1 | 0 | -1 | -1 |
| | 31 | 109 | -1 | -1 | -1 | -1 | 208 | -1 | -1 | -1 | -1 | -1 | -1 | -1 | -1 | -1 | -1 | -1 | -1 | -1 | -1 | -1 | 0 | -1 |
| | 136 | 47 | -1 | -1 | -1 | -1 | -1 | 73 | -1 | -1 | -1 | -1 | -1 | -1 | -1 | -1 | -1 | -1 | -1 | -1 | -1 | -1 | -1 | 0 |

ENCODING METHOD AND DEVICE AND DECODING METHOD AND DEVICE FOR STRUCTURED LDPC

CROSS-REFERENCE TO RELATED APPLICATIONS

This application is a continuation of U.S. application Ser. No. 16/301,290, which claimed the priority to International Patent Application No. PCT/CN2017/070488, filed on Jan. 6, 2017, which further claimed the priority to Chinese patent applications No. 201610319410.1 filed on May 13, 2016 and No. 201610884876.6 filed on Oct. 10, 2016, contents of all of which are incorporated herein by reference in their entireties.

TECHNICAL FIELD

The present disclosure relates to the field of communications and, particularly, to an encoding method and device and a decoding method and device for a structured low density parity check (LDPC) code.

BACKGROUND

With the development of wireless digital communications and the emergence of various high-rate and burst traffic, increasingly higher requirements are imposed on error correction encoding techniques. FIG. 1 shows a typical digital communication system. LDPC codes are linear block codes that may be defined by a highly sparse parity check matrix or a bipartite graph. They are originally discovered by Gallager and thus called Gallager codes. It has been unknown for decades. However, with the development of computer hardware and related theories, MacKay and Neal rediscovered the LDPC code and proved its ability to approach the Shannon limit. Latest researches show that the LDPC code is characterized by low decoding complexity, linear time encoding, the ability to approach the Shannon limit, parallel decoding and better performance than Turbo codes at greater code lengths.

The LDPC codes are special linear block codes. In communications, every time a codeword with a block length of N bits is transmitted, in order to ensure a certain error correction capability, M parity bits are required and each codeword needs to satisfy $Hx^T=0^T$, where H is a parity check matrix of M×N dimensions in a field with two entryas. All operations are performed in the field with two entries GF(2), where addition and subtraction are "XOR" operations and multiplication is an "AND" operation.

The LDPC codes are linear block codes based on a sparse check matrix. The sparsity of the check matrix helps achieve low-complexity LDPC encoding and decoding, thus making the LDPC codes more practical. The above-mentioned Gallager code is a regular LDPC code, and Luby and Mitzenmacher et al. generalize the Gallager code and propose an irregular LDPC code. The encoding originally proposed by Gallager has a regular code structure and the check matrix is a sparse matrix, each row of which has the same number of 1 and each column of which also has the same number of 1. M. G. Luby believes that if the number of non-zero entries in the rows or columns of the check matrix is allowed to change and the sparsity of the matrix is guaranteed, a decoding algorithm for encoding the LDPC code may still be adopted and the encoding performance can be greatly improved to achieve or even exceed the performance of the Turbo code. The reason is that in this encoding structure, if left and right nodes of a corresponding bipartite graph have a proper degree distribution, a waveform effect will occur in a decoding process, which will greatly improve decoding performance. The irregular code is a low-density code that allows same nodes to have different degrees. Accordingly, the code originally proposed by Gallager is called the regular code.

The LDPC parity check matrix is represented by the bipartite graph. The bipartite graph and the check matrix have one-to-one correspondence. An M×N parity check matrix H defines the constraint of M parity check sets on each codeword of N bits. One bipartite graph includes N variable nodes and M parity check nodes. When the m-th check involves the n-th bit, that is, an entry Hm in the m-th row and the n-th column in H; when n=1, a check node m will be connected to a variable node n by a line. In the bipartite graph, any node of the same class will not be connected, and the total number of edges in the bipartite graph is equal to the number of non-zero entries in the check matrix.

A concept girth is used for a quantitative description of a short circle in the bipartite graph. In the graph theory, a girth of the bipartite graph refers to the length of the shortest circle in the graph. For example, if one bipartite graph has circles of lengths 6, 8, 10, 12 and greater, the girth of the bipartite graph is 6. The girth of a variable node refers to the length of the shortest circle passing through this node. Since one variable node uniquely corresponds to one codeword bit, the girth of one codeword bit is the girth of one variable node. Structured LDPC code A structured LDPC code is one of the most popular LDPC codes in the industry and is also called Quasi Cyclick-LDPC (QC-LDPC). It has the widest application and currently appears in IEEE802.11n/ad, IEEE802.16e and other international standards. This type of LDPC codes is often called a quasi-cyclic LDPC code or a multilateral LDPC code in academia.

The parity check matrix H of the structured LDPC code is set to an (M×z)×(N×z) matrix, which is composed of M×N block matrices. Each block matrix is a different power of a z×z basic permutation matrix. When the basic permutation matrix is an identity matrix, the block matrices are cyclic shift matrices of the identity matrix (the default shift is a right shift here). Such a power j may uniquely identify each block matrix. The power of the identity matrix may be represented by 0, and the zero matrix is generally represented by −1. In this way, if each block matrix of H is replaced by its power, an M×N power matrix Hb is obtained. Here, Hb is defined as a base matrix of H and H is called an expansion matrix of Hb. In practical encoding, z is a code length divided by the number N of columns of the base matrix and is called an expansion factor. The expansion factor, or expand factor, is also known as lift size.

For example, a matrix is given:

$$H=\begin{bmatrix}1&0&0&0&1&0&1&0&0&0&0&0\\0&1&0&0&0&1&0&1&0&0&0&0\\0&0&1&1&0&0&0&0&1&0&0&0\\0&0&1&0&1&0&0&0&1&0&1&0\\1&0&0&0&0&1&1&0&0&0&0&1\\0&1&0&1&0&0&0&1&0&1&0&0\end{bmatrix}$$

The matrix may be obtained by expanding a 2×4 base matrix Hb by a parameter z which are given as follows:

$$z = 3 \text{ and } H_b = \begin{bmatrix} 0 & 1 & 0 & -1 \\ 2 & 1 & 2 & 1 \end{bmatrix}$$

An exact definition is described as follows: an (N, K) structured LDPC code is defined by an (mb×z)×(nb×z) parity check matrix H. The parity check matrix H is determined by three variables: an mb×nb base matrix Hb, an expansion factor z and a basic permutation matrix P. An information sequence length is K=(nb−mb)×z, a codeword length is N=nb×z, and a code rate is r=k/n. Each entry in the base matrix Hb is replaced with an all-zero square matrix or an $hb_{ij}$ power matrix of the basic permutation matrix P, the base matrix Hb is expanded to obtain the parity check matrix H, where $hb_{ij}$ is an entry in Hb. The base matrix Hb is defined as:

$$Hb = \begin{bmatrix} hb_{00} & hb_{01} & \dots & hb_{0(nb-1)} \\ hb_{10} & hb_{11} & \dots & hb_{1(nb-1)} \\ \dots & \dots & \dots & \dots \\ hb_{(mb-1)0} & hb_{(mb-1)1} & \dots & hb_{(mb-1)(nb-1)} \end{bmatrix}$$

The parity check matrix H is defined as:

$$H = \begin{bmatrix} P^{hb_{00}} & P^{hb_{01}} & \dots & P^{hb_{0(nb-1)}} \\ P^{hb_{10}} & P^{hb_{11}} & \dots & P^{hb_{1(nb-1)}} \\ \dots & \dots & \dots & \dots \\ P^{hb_{(mb-1)0}} & P^{hb_{(mb-1)1}} & \dots & P^{hb_{(mb-1)(nb-1)}} \end{bmatrix}$$

Therefore, in other words, an encoder of the LDPC code is uniquely generated by the base matrix Hb, the expansion factor z and the selected basic permutation matrix. According to the above definition of the base matrix, it can be seen that the base matrix and the parity check matrix are essentially the same under a given expansion factor (an integer z greater than 1).

LDPC Encoding

A direct encoding method for a system block code is to divide a codeword x into N−M information bits s and M parity bits c. Accordingly, the M×N parity check matrix H is divided into an M×(N−M) block and an M×M block which respectively corresponds to the information bits and the parity bits, that is, H=[A|B]. Given H×x=0, we can obtain:

$$[A \mid B] \times \left[\frac{s}{c}\right] = 0$$

Thus, it is obtained that A×s+B×c=0 and it is further derived that $c=B^{-1}As$. When a block B has a special matrix structure such as a strict lower triangular structure (semi-random matrix) and a double lower triangular structure, $B^{-1}$ is very simple in form and the parity bits c in the codeword may be directly calculated according to the above formula, thus ensuring that the encoder has linear complexity.

The Richarson linear time encoding algorithm may also be adopted. The parity check matrix H has a quasi-lower triangular structure and it is assumed that H has the following form:

$$H = \begin{pmatrix} A & B & T \\ C & D & E \end{pmatrix}$$

Let an encoded codeword be $x=(s, p_1, p_2)$, where s is systematic bits of the encoded codeword, and $p_1$ and $p_2$ are parity bits of the codeword. $p_1$ has a length of g and $p_2$ has a length of (m−g). In the above formula, the dimensions of A, B, T, C, D and E are respectively (m−g)×(n−m), (m−g)×g, (m−g)×(m−g), g×(n−m), g×g and g×(m−g). All these matrices are sparse matrices, and T is a lower triangular matrix whose main diagonal entries are all 1s. The parity bits may be obtained according to the following formula:

$$p_1^T = -\varphi^{-1}(-ET^{-1}A+C)s^T$$

$$p_2^T = -T^{-1}(As^T+Bp_1^T) \text{ where } \varphi = -ET^{-1}B+D$$

Considering a vector characteristic of the structured LDPC code, a vector decoding method may also be considered. If the parity bits of one structured LDPC code constitute a strict lower triangular matrix, the LDPC encoding may be performed in the following vector manner, which is very mature and simple.

The encoded codeword of the (n, k) structured LDPC code is c=(x,b), where $x=(x_0, x_1, \dots, x_{k-1})$ is an information sequence and $b=(b_0, b_1, \dots, b_{n-k-1})$ is a check sequence. The LDPC encoding is performed on the inputted information sequence x of k bits to generate the check sequence b of n−k bits and the encoded LDPC codeword c=[x, b], where n=nb×z, k=kb×z, kb=nb−mb, and z is the expansion factor. The information sequence x may be divided into kb subsequences of a length z:

$$x=[x(0),x(1),x(2), \dots, x(kb-1)]$$

Each subsequence is written as:

$$x(i)=[x_{i\times z}, x_{i\times z+1}, x_{i\times z+2}, \dots, x_{i\times z+z-1}]$$

The check sequence b is divided into mb subsequences of a length z:

$$b=[b(0),b(1),b(2), \dots, b(mb-1)]$$

Each subsequence is written as:

$$b(i)=[b_{i\times z}, b_{i\times z+1}, b_{i\times z+2}, \dots, b_{i\times z+z-1}]$$

An intermediate variable sequence v is defined and v is divided into mb subsequences of a length z:

$$v=[v(0),v(1),v(2), \dots, v(mb-1)]$$

Each subsequence is written as:

$$v(i)=[v_{i\times z}, v_{i\times z+1}, v_{i\times z+2}, \dots, v_{i\times z+z-1}]$$

The LDPC code is encoded as follows:

The intermediate variable sequence v is calculated.

$$(v(i))^T = \sum_{j=0}^{kb-1} P^{hb_{ij}} \times (x(j))^T \quad i = 0, 1, \dots, (mb-1)$$

The check sequence b is calculated.

$$(b(0))^T = P^{(z-hb_{0(nb-mb)})mod\ z} \times (v(0))^T$$

$$(b(i))^T = P^{(z-hb_{i(nb-mb+i)})mod\ z}\left((v(i))^T + \sum_{j=kb}^{kb+i-1} P^{hb_{ij}} \times (b(j-kb))^T\right)\ i = 1, 2, 3, \ldots, (mb-1)$$

The LDPC codeword c=[x, b] is calculated.

In conclusion, the encoder of the LDPC code may be uniquely described by the LDPC parity check matrix H. Mature and simple specific encoding methods will not be repeated here. In addition, the parity check matrix of the LDPC code not only determines the performance of a decoder of the LDPC code but also determines the complexity, storage space and processing delay of the codec of the LDPC code, and further determines whether an incremental redundancy HARQ may be supported and whether the codec have sufficient flexibility. Therefore, it is crucial to find an appropriate parity check matrix of the LDPC code and the parity check matrix determines the prospect of the LDPC code.

In a specific implementation, the above direct method or the Richarson method or other methods may be used for operations to implement the encoding function of obtaining the N-bit codeword from (N−M)-bit source data. In fact, the encoder is to implement multiplication and addition of a sparse matrix using software or hardware. For the LDPC code based on the identity matrix and the cyclic shift matrix, the multiplication of the sparse matrix may be performed by a plurality of z-bit (z is the expansion factor) cyclic shift registers and a plurality of z-bit adders, and the addition of the sparse matrix is performed by the plurality of z-bit adders. The plurality of z-bit cyclic shift registers and the plurality of z-bit adders construct an LDPC encoder implemented by a hardware circuit.

LDPC Decoding

The LDPC parity check matrix is represented by the bipartite graph. The bipartite graph and the check matrix have one-to-one correspondence. An M×N parity check matrix H defines the constraint of M parity check sets on each codeword of N bits. One bipartite graph includes N variable nodes and M parity check nodes. When the m-th check involves the n-th bit, that is, an entry Hm in the m-th row and the n-th column in H when n=1, a check node m will be connected to a variable node n by a line. In the bipartite graph, any node of the same class will not be connected, and the total number of edges in the bipartite graph is equal to the number of non-zero entries in the check matrix.

An information transfer decoding algorithm for the LDPC code assumes that the variable nodes are independent of each other, and the existence of a short circle destroys the assumption of independence, resulting in significantly degraded decoding performance. In fact, if the length of the shortest circle in the bipartite graph corresponding to the LDPC parity check matrix is greater, that is, the girth value is greater, the positive feedback information transmitted from the variable nodes to themselves is smaller and the decoding performance is better. Relevant conclusions are drawn on the relationship between the girth of the check matrix H and the base matrix Hb through the verification by mathematical reasoning and computer simulation.

The girth of the bipartite graph, the girth of the node, and the girth of the edge are explained below. The concept girth is introduced for a quantitative description of the short circle in the bipartite graph. The girth of the bipartite graph refers to the length of the shortest circle in the graph. For example, if one bipartite graph has circles of lengths 6, 8, 10, 12 and greater, the girth of the bipartite graph is 6. In the bipartite graph, the girth of some node u (the girth at node u) refers to the length of the shortest circle passing through the node u. For example, if circles of lengths 8, 10, 12 and greater pass through the node u, the girth of the node u is 8. In the bipartite graph, the girth of some edge e (the girth at node u) refers to the length of the shortest circle passing through the edge e. For example, if circles of lengths 8, 10, 12 and greater pass through the edge e, the girth of the edge e is 8.

The girth of one variable node is the length of the shortest path, which is equivalent to the minimum number of iterations of information transmitted from the variable node to the node itself. Before the practical number of iterations reaches the minimum number of iterations, information associated with this node may be optimally transferred to the remainder of the bipartite graph. If the girth of some variable node is greater, the positive feedback information of the information transmitted from the variable node to itself is smaller and the decoding performance is better. Therefore, it is advantageous to make the girth of the variable node as great as possible to improve the decoding performance. In conclusion, the principle of constructing a high LDPC code is as follows: the length of the shortest circle (girth) of a selected code should be as great as possible and the number of the shortest circles of the selected code should be as small as possible among the codes of the same girth.

In practical applications, the base matrix is expanded to obtain the parity check matrix and the parity check matrix may also be referred to as an expansion matrix or a binary matrix. An analysis of the topology of the check matrix shows that the z×z block matrices of the expansion matrix uniquely corresponds to the entries of the base matrix. If some entries in the base matrix do not form the short circle, the block matrices corresponding to these entries will not form the short circle in the expansion matrix. Therefore, to study the short circle of the expansion matrix, it is only necessary to study the expansion matrix of the base matrix which has the short circle. On the basis of an analysis of the topology of the check matrix and the bipartite graph, only when a short circle of a length 4 appears in the base matrix $H_b$, the expansion matrix H of $H_b$ may have short circles of lengths 4 or greater. For example, four power entries i, j, k and l corresponding to four z×z block matrices $P_i$, $P_j$, $P_k$ and $P_l$ form a short circle of a length 4 in $H_b$; if mod(i−j+k−l, z)=0, $P_i$, $P_j$, $P_k$ and $P_l$ form a short circle of a length 4 in H; and if mod(i−j+k−l,z)=z/2, $P_i$, $P_j$, $P_k$ and $P_l$ form a short circle of a length 8 in H. In other cases, $P_i$, $P_j$, $P_k$ and $P_l$ form a short circle of a length 12 or do not form a short circle in H.

On the basis of the analysis of the topology of the check matrix and the bipartite graph, only when a short circle of a length 6 appears in the base matrix $H_b$, the expansion matrix H of $H_b$ may have short circles of lengths 6 or greater. For example, power entries i, j, k, l, m and n corresponding to six z×z block matrices $P_i$, $P_j$, $P_k$, $P_l$, $P_m$ and $P_n$ form a short circle of a length 6 in $H_b$; if mod(i−j+k−l+m−n,z)=0, $P_i$, $P_j$, $P_k$, $P_l$, $P_m$ and $P_n$ form a short circle of a length 6 in H; and if mod(i−j+k−l+m−n,z)=z/2, $P_i$, $P_j$, $P_k$, $P_l$, $P_m$ and $P_n$ form a short circle of a length 10 in H. In other cases, $P_i$, $P_j$, $P_k$, $P_l$, $P_m$ and $P_n$ form short circles of lengths 12 or greater, or do not form a short circle in H.

On the basis of the analysis of the topology of the check matrix and the bipartite graph, only when a short circle of a length 8 appears in the base matrix $H_b$, the expansion matrix H of $H_b$ may have short circles of lengths 8 or greater. For example, power entries i, j, k, l, m, n, s and t corresponding to eight z×z block matrices $P_i$, $P_j$, $P_k$, $P_l$, $P_m$, $P_n$, $P_s$ and $P_t$ form a short circle of a length 8 in $H_b$; if mod(i−j+k−l+m−n+s−t,z)=0, $P_i$, $P_j$, $P_k$, $P_l$, $P_m$, $P_n$, $P_s$ and $P_t$ form a short circle of a length 8 in H; and in other cases, $P_i$, $P_j$, $P_k$, $P_l$, $P_m$, $P_n$, $P_s$ and $P_t$ form a short circle of a length 12 or do not form a short circle in H.

Base Matrix Correction

If the same base matrix cannot be applied to different expansion factors, the LDPC codec needs to store different base matrices for different code lengths. Many code lengths require the storage of many base matrices, thus occupying a lot of storage space or resulting in a complicated hardware implementation circuit.

Matrix correction is to correct non-negative entries in the base matrix Hb using the expansion factor of another code length. The corrected entry value should be smaller than the value of the expansion factor of this code length. Correction algorithms include modulo, scale and floor or scale and round. Let $P_{i,j}$ be the non-negative entry in the i-th row and the j-th column of the base matrix Hb and $P'_{i,j}$ be the corrected entry, the following formulas are given.

For the modulo algorithm, the formula is $$P'_{ij} = P_{ij} \bmod \frac{n}{N}$$

For the scale and floor algorithm, the formula is $$P'_{ij} = \left[P_{ij} \times \frac{n}{2304}\right]$$

For the scale and round algorithm, the formula is $$P'_{ij} = \text{Round}\left(P_{ij} \times \frac{n}{2304}\right)$$

In the above formulas, N denotes the number of columns of the base matrix Hb, n denotes the LDPC code length in the parity check matrix, mod is a modulo operation, [ ] is a floor operation, and Round is a rounding operation. Here, it is assumed that the maximum code length is 2304.

For example, for an LDPC code of a code length of 1152 bits, if one non-negative entry in the base matrix Hb is 93, correction results are as follows:

For the modulo algorithm, the correction result is $$93 \bmod \frac{1152}{24} = 93 \bmod 48 = 45$$

For the scale and floor algorithm, the correction result is $$\left[93 \times \frac{1152}{2304}\right] = [46.5] = 46$$

For the scale and round algorithm, the correction result is $$\text{Round}\left(93 \times \frac{1152}{2304}\right) = \text{Round}\ (46.5) = 47$$

If the most popular layered decoding is applied to the LDPC codes, the reading and writing of log-likelihood ratio information will seriously affect the arrangement of LDPC pipelines. Specifically, at a high code rate, for a common LDPC code structure, the decoder needs to complete the processing of one row of the base matrix before the decoder starts the next pipeline. If one pipeline is petty long, the efficiency of the decoder will be seriously degraded.

In 3GPP standards, a new air interface of the 5th generation mobile communication standards (5G New RAT) is officially established. This new air interface needs to support ultra-high throughput and a low processing delay and requires a new encoding scheme to replace the current turbo encoding scheme. However, the LDPC code in the current communication standards cannot well support an incremental redundancy HARQ and has insufficient flexibility of code rates and transport block sizes. Therefore, it is necessary to design a new LDPC encoding structure to ensure that the LDPC code has performance and flexibility close to the turbo code, can support the incremental redundancy HARQ, and has much lower complexity than the turbo code and ultra-high-speed processing capabilities.

SUMMARY

Embodiments of the present disclosure provide an encoding method and device and a decoding method and device for a structured LDPC code.

An embodiment of the present disclosure provides an encoding method for a structured LDPC code. The encoding method includes the steps described below. A base matrix Hb used for encoding is determined, where the base matrix Hb includes an Mb×Kb block A corresponding to a plurality of systematic bits and an Mb×Mb block B corresponding to a plurality of parity bits to have Hb=[A, B], and $hb_{ij}$ denotes an entry in an i-th row and a j-th column of the base matrix Hb, where i is a row index of the base matrix Hb, j is a column index of the base matrix Hb, wherein Kb=Nb−Mb, Kb is an integer greater than or equal to 4, Nb is an integer, i=1, . . . , Mb and j=1, . . . , Nb. The base matrix Hb includes multiple submatrices, the submatrices include an upper-left submatrix Hb1 and an upper-left submatrix Hb2, a number of rows of the upper-left submatrix Hb1 and the number of rows of the upper-left submatrix Hb2 both are smaller than the number of rows of the base matrix Hb, a numbers of columns of the upper-left submatrix Hb1 and the number of columns of the upper-left submatrix Hb2 both are smaller than the number of columns of the base matrix Hb, and the upper-left submatrix Hb1 is an upper-left submatrix of the upper-left submatrix Hb2. An LDPC encoding operation is performed on a source information bit sequence according to the base matrix Hb and an expansion factor Z corresponding to the base matrix Hb to obtain a codeword sequence, where Z is a positive integer greater than or equal to 1.

An embodiment of the present disclosure provides a decoding method for a structured LDPC code. The decoding method includes the steps described below. A base matrix Hb used for decoding is determined, where the base matrix Hb includes an Mb×Kb block A corresponding to a plurality of systematic bits and an Mb×Mb block B corresponding to a plurality of parity bits to have Hb=[A, B], and $hb_{ij}$ denotes an entry in an i-th row and a j-th column of the base matrix Hb, wherein i is a row index of the base matrix Hb, j is a column index of the base matrix Hb, wherein Kb=Nb−Mb, Kb is an integer greater than or equal to 4, Nb is an integer, i=1, . . . , Mb and j=1, . . . , Nb. The base matrix Hb includes multiple submatrices, the submatrices include an upper-left submatrix Hb1 and an upper-left submatrix Hb2, the number of rows of the upper-left submatrix Hb1 and the number of rows of the upper-left submatrix Hb2 both are smaller than the number of rows of the base matrix Hb, a numbers of columns of the upper-left submatrix Hb1 and the number of columns of the upper-left submatrix Hb2 both are smaller than the number of columns of the base matrix Hb, and the upper-left submatrix Hb1 is an upper-left submatrix of the upper-left submatrix Hb2. A decoding operation is performed on a codeword of a preset number of bits according to the base matrix Hb and an expansion factor Z corresponding to the base matrix Hb to obtain a source information bit sequence, where Z is a positive integer greater than or equal to 1.

Another embodiment of the present disclosure provides an encoding device for a structured LDPC code. The encoding device includes a determining module and an encoding module.

The determining module is configured to determine a base matrix Hb used for encoding, where the base matrix Hb includes an Mb×Kb block A corresponding to a plurality of systematic bits and an Mb×Mb block B corresponding to a plurality of parity bits to have Hb=[A, B], and $hb_{ij}$ denotes an entry in an i-th row and a j-th column of the base matrix Hb, where i is a row index of the base matrix Hb, j is a column index of the base matrix Hb, wherein Kb=Nb−Mb, Kb is an integer greater than or equal to 4, Nb is an integer, i=1, . . . , Mb and j=1, . . . , Nb. The base matrix Hb includes multiple submatrices, the submatrices include an upper-left submatrix Hb1 and an upper-left submatrix Hb2, the number of rows of the upper-left submatrix Hb1 and the number of rows of the upper-left submatrix Hb2 both are smaller than the number of rows of the base matrix Hb, a numbers of columns of the upper-left submatrix Hb1 and the number of columns of the upper-left submatrix Hb2 both are smaller than the number of columns of the base matrix Hb, and the upper-left submatrix Hb1 is an upper-left submatrix of the upper-left submatrix Hb2.

The encoding module is configured to perform an LDPC encoding operation on a source information bit sequence according to the base matrix Hb and an expansion factor Z corresponding to the base matrix Hb to obtain a codeword sequence, where Z is a positive integer greater than or equal to 1.

Another embodiment of the present disclosure provides a decoding device for a structured LDPC code. The decoding device includes a determining module and a decoding module.

The determining module is configured to determine a base matrix Hb used for decoding, where the base matrix Hb includes an Mb×Kb block A corresponding to a plurality of systematic bits and an Mb×Mb block B corresponding to a plurality of parity bits to have Hb=[A, B], and $hb_{ij}$ denotes an entry in an i-th row and a j-th column of the base matrix Hb, where i is a row index of the base matrix Hb, j is a column index of the base matrix Hb, wherein Kb=Nb−Mb, Nb is an integer, Kb is an integer greater than or equal to 4, i=1, . . . , Mb and j=1, . . . , Nb. The base matrix Hb includes multiple submatrices, the submatrices include an upper-left submatrix Hb1 and an upper-left submatrix Hb2, the number of rows of the upper-left submatrix Hb1 and the number of rows of the upper-left submatrix Hb2 both are smaller than the number of rows of the base matrix Hb, a numbers of columns of the upper-left submatrix Hb1 and the number of columns of the upper-left submatrix Hb2 both are smaller than the number of columns of the base matrix Hb, and the upper-left submatrix Hb1 is an upper-left submatrix of the upper-left submatrix Hb2.

The decoding module is configured to perform a decoding operation on a codeword of a preset number of bits according to the base matrix Hb and an expansion factor Z corresponding to the base matrix Hb to obtain a source information bit sequence, where Z is a positive integer greater than or equal to 1.

Another embodiment of the present disclosure further provides a storage medium. The storage medium is configured to store program codes for executing the steps described below. Abase matrix Hb used for encoding is determined, where the base matrix Hb includes an Mb×Kb block A corresponding to a plurality of systematic bits and an Mb×Mb block B corresponding to a plurality of parity bits to have Hb=[A, B], and $hb_{ij}$ denotes an entry in an i-th row and a j-th column of the base matrix Hb, where i is a row index of the base matrix Hb, j is a column index of the base matrix Hb, wherein Kb=Nb−Mb, Kb is an integer greater than or equal to 4, Nb is an integer, i=1, . . . , Mb and j=1, . . . , Nb. The base matrix Hb includes multiple submatrices, the submatrices include an upper-left submatrix Hb1 and an upper-left submatrix Hb2, the number of rows of the upper-left submatrix Hb1 and the number of rows of the upper-left submatrix Hb2 both are smaller than the number of rows of the base matrix Hb, a numbers of columns of the upper-left submatrix Hb1 and the number of columns of the upper-left submatrix Hb2 both are smaller than the number of columns of the base matrix Hb, and the upper-left submatrix Hb1 is an upper-left submatrix of the upper-left submatrix Hb2. An LDPC encoding operation is performed on a source information bit sequence according to the base matrix Hb and an expansion factor Z corresponding to the base matrix Hb to obtain a codeword sequence, where Z is a positive integer greater than or equal to 1.

Another embodiment of the present disclosure further provides a storage medium. The storage medium is configured to store program codes for executing the steps described below.

A base matrix Hb used for decoding is determined, where the base matrix Hb includes an Mb×Kb block A corresponding to a plurality of systematic bits and an Mb×Mb block B corresponding to a plurality of parity bits to have Hb=[A, B], and $hb_{ij}$ denotes an entry in an i-th row and a j-th column of the base matrix Hb, wherein i is a row index of the base matrix Hb, j is a column index of the base matrix Hb, wherein Kb=Nb−Mb, Kb is an integer greater than or equal to 4, Nb is an integer, i=1, . . . , Mb and j=1, . . . , Nb. The base matrix Hb includes multiple submatrices, the submatrices include an upper-left submatrix Hb1 and an upper-left submatrix Hb2, the number of rows of the upper-left submatrix Hb1 and the number of rows of the upper-left submatrix Hb2 both are smaller than the number of rows of the base matrix Hb, a numbers of columns of the upper-left submatrix Hb1 and the number of columns of the upper-left submatrix Hb2 both are smaller than the number of columns of the base matrix Hb, and the upper-left submatrix Hb1 is an upper-left submatrix of the upper-left submatrix Hb2.

A decoding operation is performed on a codeword of a preset number of bits according to the base matrix Hb and an expansion factor Z corresponding to the base matrix Hb to obtain a source information bit sequence, where Z is a positive integer greater than or equal to 1.

The embodiments of the present disclosure design an appropriate base matrix and perform the encoding and decoding according to the base matrix and the corresponding expansion factor, thereby achieving ultra-high-speed LDPC encoding and decoding and gaining encoding and decoding performance close to the turbo code, and the LDPC codec can support the incremental redundancy HARQ and has sufficient flexibility.

BRIEF DESCRIPTION OF DRAWINGS

The drawings described herein are used to provide a further understanding of the present disclosure, and form a part of the present application. The exemplary embodiments and descriptions thereof in the present disclosure are used to explain the present disclosure and do not limit the present disclosure in any improper way. In the accompanying drawings.

DETAILED DESCRIPTION

The present disclosure will be described in detail with reference to the drawings in conjunction with the embodiments. It is to be noted that if not in collision, the embodiments and features therein in the present application may be combined with each other.

It is to be noted that the terms "first", "second" and the like in the description, claims and drawings of the present disclosure are used to distinguish between similar objects and are not necessarily used to describe a particular order or sequence.

A traditional structured LDPC code generally cannot support an incremental redundancy HARQ scheme or provide ultra-high throughput or achieve performance close to a turbo code or have sufficient flexibility. However, a base matrix has an extremely large number of possible structures and compositions. A base matrix that satisfies the above requirements is still unknown in the related art.

The embodiments of the present disclosure provide an encoding method and device and a decoding method and device, an encoder and a decoder for a structured LDPC code. For a practical purpose, the embodiments of the present disclosure use the same base matrix for a plurality of code rates and a plurality of code lengths. The base matrix is generated for the maximum code length and is corrected at different code lengths. The embodiments of the present disclosure define a girth of the base matrix of different code lengths to ensure that performance close to a turbo code can be achieved at various code lengths. However, the present disclosure is not limited to the case where the same base matrix is used for the plurality of code lengths. It is also applicable to a case where a respective base matrix is used for each code length.

It is to be noted that the present application is not limited to the matrix structure therein. For example, a matrix corresponding to systematic bits and a matrix corresponding to parity bits are interchangeable in position. Encoding and decoding schemes based on the concept of the embodiments of the present application should fall within the scope of the present application.

Embodiment 1

Figure 1:
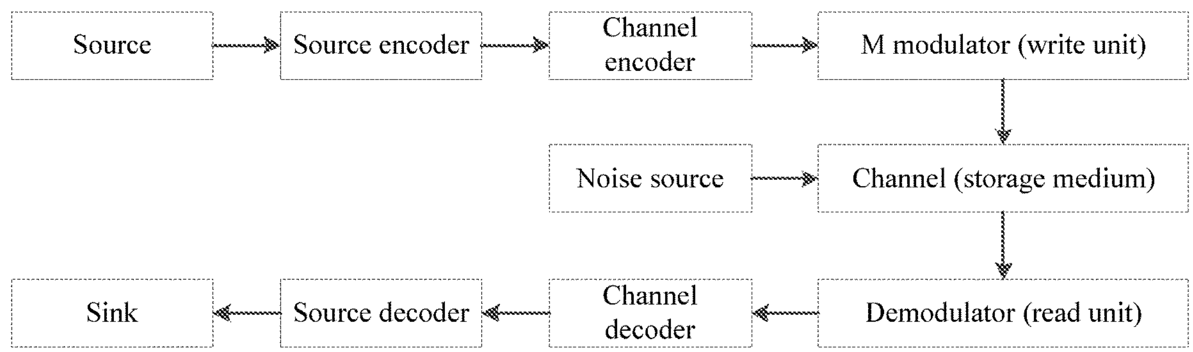
FIG. 1 is a block diagram of a digital communication system in the related art.
Figure 2:
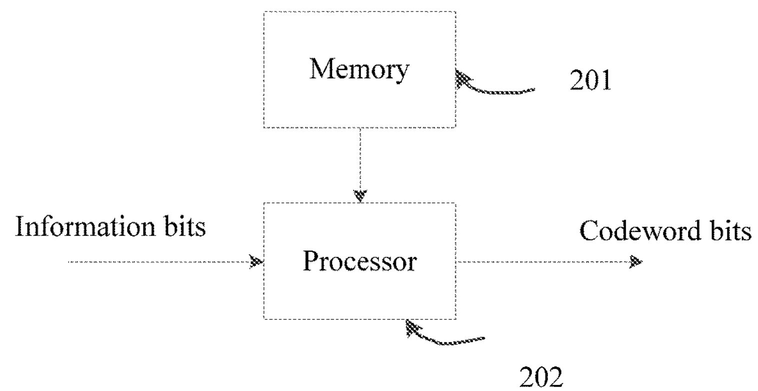
FIG. 2 is a structural diagram of an encoder for a structured LDPC code according to an embodiment 1 of the present disclosure.

The embodiments of the present disclosure provide an encoding device for a structured LDPC code in digital communications. As shown in FIG. 2, the encoding device includes at least a processor 202 and a memory 201.

The memory 201 is configured to store at least a base matrix used for encoding.

The base matrix includes an Mb×Kb block A corresponding to a plurality of systematic bits and an Mb×Mb block B corresponding to a plurality of parity bits to have Hb=[A, B], and $hb_{ij}$ denotes an entry in an i-th row and a j-th column of the base matrix Hb, where i is a row index of the base matrix Hb, j is a column index of the base matrix Hb, where Kb=Nb−Mb, Nb is an integer, Kb is an integer greater than or equal to 4, i=1, . . . , Mb and j=1, . . . , Nb. The base matrix Hb includes multiple submatrices, the submatrices include an upper-left submatrix Hb1 and an upper-left submatrix Hb2. The number of rows of the upper-left submatrix Hb1 and the number of rows of the upper-left submatrix Hb2 both are smaller than the number of rows of the base matrix Hb, a numbers of columns of the upper-left submatrix Hb1 and the number of columns of the upper-left submatrix Hb2 both are smaller than the number of columns of the base matrix Hb, and the upper-left submatrix Hb1 is an upper-left submatrix of the upper-left submatrix Hb2.

In an embodiment, the upper-left submatrix Hb1 consists of an intersection of the first L0 rows and the first Kb+4 columns of the matrix Hb, the number of entries corresponding to a Z×Z non-zero square matrix in each row of the upper-left submatrix Hb1 is less than or equal to Kb+2 and greater than or equal to Kb−2, and a square matrix including the last four columns of the upper-left submatrix Hb1 is a lower-left triangular matrix or a quasi-lower-left triangular matrix.

And/or the upper-left submatrix Hb2 consists of an intersection of the first Kb rows and the first 2×Kb columns of the matrix Hb, each entry in a submatrix consisting of an intersection of the first 4 rows and the last Kb−4 columns of the upper-left submatrix Hb2 corresponds to a Z×Z zero square matrix, a submatrix consisting of an intersection of the last Kb−4 rows and the last Kb−4 columns of the upper-left submatrix Hb2 is an (Kb−4)×(Kb−4) lower-left triangular matrix or quasi-lower-left triangular matrix, and each entry in a submatrix consisting of an intersection of the last Kb−4 rows and the (Kb+1)-th to (Kb+3)-th columns of the upper-left submatrix Hb2 corresponds to the Z×Z zero square matrix.

When the square matrix including the last four columns of the upper-left submatrix Hb1 is a lower triangular matrix, only one entry in an (Kb+1)-th column of the upper-left submatrix Hb2 corresponds to the Z×Z non-zero square matrix. When the square matrix including the last four columns of the upper-left submatrix Hb1 is a quasi-lower triangular matrix, each entry in the (Kb+1)-th column of the upper-left submatrix Hb2 corresponds to the Z×Z zero square matrix.

The number of entries corresponding to the Z×Z non-zero square matrix in each row of a submatrix consisting of an intersection of the last Kb−4 rows and the first Kb columns of the upper-left submatrix Hb2 is less than or equal to Kb−2.

Nb is greater than or equal to 2×Kb and L0 is equal to 4 or 3.

(2) An expansion factor Z supports a set of determined values $\{z_1, z_2, z_3, \ldots, z_V\}$, where $z_1, z_2, \ldots, z_V$ are arranged in an ascending order, and $z_r$, $z_s$, $z_t$, $z_u$ are four expansion factors in the set of the determined values and satisfy $z_1 \le z_r \le z_s \le z_t \le z_u \le z_V$, where V, r, s, t and u are subscripts, $1 \le r \le s \le t \le u \le V$, and V is an integer greater than or equal to 2.

In a case where $z_1 \le Z = z_i < z_r$, for the LDPC code corresponding to the expansion factor $Z=z_i$ and the base matrix Hb, at least one bit of codeword bits having a weight greater than 2 in each LDPC codeword has a girth equal to 4; and for the LDPC code corresponding to the expansion factor $Z=z_i$ and the base matrix Hb with heaviest R columns deleted, all codeword bits having a weight greater than 2 in each LDPC codeword have a girth equal to 6, where R is less than or equal to Kb/2.

In a case where $z_r \le Z = z_i < z_s$, for the LDPC code corresponding to the expansion factor $Z=z_i$ and the base matrix Hb, all codeword bits having a weight greater than 2 in each LDPC codeword have a girth equal to 6.

In a case where $z_s \le Z = z_i < z_t$, for the LDPC code corresponding to the expansion factor $Z=z_i$ and the base matrix Hb, all systematic bits having a weight greater than 2 in each LDPC codeword have a girth equal to 6 and at least one parity bit having a weight greater than 2 in each LDPC codeword has a girth greater than or equal to 8.

In a case where $z_t \le Z = z_i < z_u$, for the LDPC code corresponding to the expansion factor $Z=z_1$ and the base matrix Hb, all codeword bits having a weight greater than 2 in each LDPC codeword have a girth equal to 8.

In a case where $z_u \le Z = z_i < z_V$, for the LDPC code corresponding to the expansion factor $Z=z_i$ and the base matrix Hb, all systematic bits having a weight greater than 2 in each LDPC codeword have a girth equal to 8 and at least one parity bit having a weight greater than 2 in each LDPC codeword has a girth greater than or equal to 10.

Each codeword bit of one LDPC codeword corresponds to a respective column of a parity check matrix, a weight of the each codeword bit refers to the number of non-zero entries in the respective column of the parity check matrix, and i=1, 2, . . . , V.

Each codeword bit of one LDPC codeword corresponds to the respective column of the parity check matrix.

The weight of the each codeword bit refers to the number of non-zero entries in the respective column of the parity check matrix, and i=1, 2, . . . , V.

An LDPC encoding operation is performed on a source information bit sequence of (Nb−Mb)×Z bits according to the base matrix Hb and the expansion factor Z corresponding to the base matrix Hb to obtain a codeword sequence of Nb×Z bits, where Z is the expansion factor and a positive integer greater than or equal to 1.

In an embodiment, the base matrix Hb may further include an upper-left submatrix Hb3.

The upper-left submatrix Hb3 consists of an intersection of the first 2×Kb rows and the first 3×Kb columns of the base matrix Hb, and a submatrix consisting of an intersection of the last Kb rows and the last Kb columns of the upper-left submatrix Hb3 is an Kb×Kb identity matrix or a cyclic shift matrix of the identity matrix.

Each entry in a submatrix consisting of an intersection of the first Kb rows and the last Kb columns of the upper-left submatrix Hb3 corresponds to the Z×Z zero square matrix.

The (Kb+1)-th to 2×Kb-th columns of the upper-left submatrix Hb3 constitute a submatrix where only one entry in each column of L1 columns corresponds to a non-zero square matrix, and each entry in remaining Kb−L1 columns corresponds to the Z×Z zero square matrix, where L1 is an integer greater than or equal to 0 and less than Kb.

Nb is greater than or equal to 3×Kb.

In an embodiment, Nb is a determined positive integer between 2×Kb and 12×Kb.

In an embodiment, Kb is an integer between 2 and 16.

In an embodiment, different Kb has different values in an enhanced mobile broadband (eMMB) scenario and an ultra-reliable and low latency communication (URLLC) scenario.

In an embodiment, in the base matrix Hb, the number of entries corresponding to the Z×Z non-zero square matrix in a g-th row is less than or equal to the number of entries corresponding to the Z×Z non-zero square matrix in a (g+1)-th row, where g=1, 2, . . . , Mb−1.

In an embodiment, the number of entries corresponding to the non-zero square matrix in a j-th column of the base matrix Hb is Lj and a first entry from top to bottom is 0; where Lj is a positive integer greater than or equal to 1 and j=1, . . . , Nb It is to be noted that the present disclosure is not limited to this manner, and the last entry may be 0 or any entry may be 0. All these manners may ensure that a cyclic shift inverse network may be omitted for layered decoding, thereby significantly reducing routing overhead and obtaining beneficial effects.

The processor 202 is configured to determine the base matrix Hb and the expansion factor z and perform the LDPC encoding operation on source data of (Nb−Mb)×z bits to obtain a codeword of Nb×z bits.

A more specific example is given below. The base matrix Hb satisfying the above requirements is shown in FIG. 3.

Figures 3, 4:
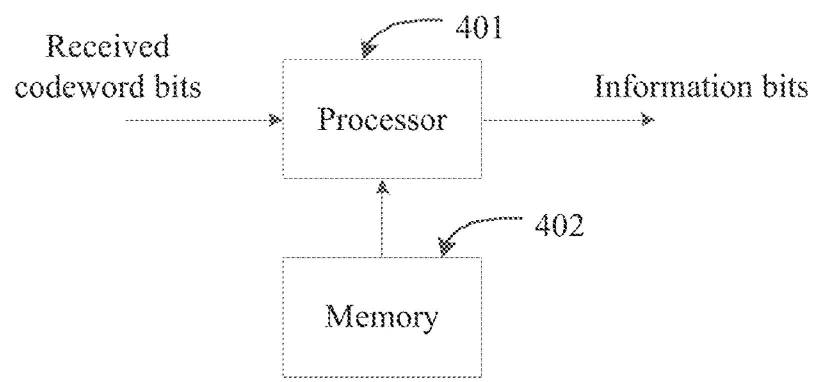
FIG. 3 is a schematic diagram of a base matrix used in the embodiment 1 of the present disclosure.
FIG. 4 is a structural diagram of a decoder for a structured LDPC code according to an embodiment 2 of the present disclosure.

For the base matrix Hb shown in FIG. 3, a code rate is ⅓, Mb=16 and Nb=24. Hb1 is a 4×12 matrix, Hb2 is an 8×16 matrix, and Hb3 is a 16×24 matrix. The expansion factor corresponding to the base matrix Hb is z=336. The matrix in FIG. 3 satisfies the characteristics of Hb1, Hb2 and Hb3 at the same time. When the characteristics of Hb1 are satisfied, the LDPC code with a code rate ⅔ has performance close to the turbo code, and the matrix has only 4 rows to provide ultra-high-speed processing. The satisfaction of the characteristics of Hb2 guarantees a preferred degree distribution of the LDPC code and that a specific TBS=336×8 (the girth value is 8) is satisfied to enable the LDPC code with a code rate ½ to achieve performance close to the turbo code. The matrix Hb2 has only 8 rows to provide ultra-high-speed processing. In addition, Hb1 is an upper-left submatrix of Hb2, and the nested structure may support an incremental redundancy HARQ. In an embodiment, the satisfaction of the characteristics of Hb3 guarantees a preferred degree distribution of the LDPC code and that a specific TBS=336×8 (the girth value is 8) is satisfied to enable the LDPC code with a code rate ⅓ to achieve performance close to the turbo code. The matrix Hb3 has only 16 rows to provide ultra-high-speed processing. In addition, Hb1 and Hb2 are both an upper-left submatrix of Hb, and the nested structure may support the incremental redundancy HARQ.

The upper-left submatrix Hb1 consists of an intersection of the first L0=4 rows and the first Kb+4=8 columns of the matrix Hb, the number of entries corresponding to the Z×Z non-zero square matrix in each row of the upper-left submatrix Hb1 is respectively 9, 10, 10 and 10, all of which are less than or equal to Kb+2=10 and greater than or equal to Kb−2=8, and a square matrix including the last four columns of the upper-left submatrix Hb1 is a lower-left triangular matrix or a quasi-lower-left triangular matrix.

In the matrix given above, the block A is a matrix of systematic bits and the block B is a matrix of parity bits. An entry value −1 corresponds to an all-zero square matrix and an entry value corresponds to a matrix after a cyclic shift of a certain value to the non-zero square matrix. Moreover, first entries corresponding to the non-zero square matrix in all columns of the base matrix Hb are all zero. At this time, a cyclic shift network only needs to implement a cyclic shift of a difference. In this case, an LDPC layered decoder with the matrix structure of the present disclosure does not require a cyclic shift inverse network and the routing overhead is halved.

In an embodiment, another characteristic is as follows: the encoder may further include an expansion module. The expansion module is configured to expand the base matrix Hb according to the expansion factor and a basic permutation matrix to obtain an (M×z)×(N×z) parity check matrix for the LDPC code. A decoding module performs an encoding operation on the parity check matrix obtained by expanding the base matrix Hb.

The present disclosure performs LDPC encoding on information bits based on the provided base matrix to generate an LDPC codeword. The LDPC codeword is transmitted to a channel after being processed by a modulation module and other modules. A receiving end receives a signal of the LDPC codeword and performs processing such as demodulation on the signal to obtain the LDPC codeword, which is sent to an LDPC decoder. The LDPC codeword is processed in such a way that a speed of decoding pipelines is improved, that is, a processing speed of the decoder is improved, thereby effectively improving efficiency of the LDPC code and increasing a decoding speed. Furthermore, the base matrix structure provided by the present disclosure may reduce switched networks and hardware complexity by omitting the use of a cyclic shift inverse network (for write and storage).

Embodiment 2

The embodiments of the present disclosure provide a decoding device for a structured low-density parity-check (LDPC) code in digital communications. As shown in FIG. 4, the decoding device includes at least a processor 402 and a memory 401.

The memory 401 is configured to store at least a base matrix used for encoding. The base matrix has the characteristics described below.

The base matrix includes an Mb×Kb block A corresponding to a plurality of systematic bits and an Mb×Mb block B corresponding to a plurality of parity bits to have Hb=[A, B], and $hb_{ij}$ denotes an entry in an i-th row and a j-th column of the base matrix Hb, where i is a row index of the base matrix Hb, j is a column index of the base matrix Hb, where Kb=Nb−Mb, Kb is an integer greater than or equal to 4, Nb is an integer, i=1, . . . , Mb and j=1, . . . , Nb.

The base matrix Hb includes multiple submatrices, the submatrices include an upper-left submatrix Hb1 and an upper-left submatrix Hb2. The number of rows of the upper-left submatrix Hb1 and the number of rows of the upper-left submatrix Hb2 both are smaller than the number of rows of the base matrix Hb, a numbers of columns of the upper-left submatrix Hb1 and the number of columns of the upper-left submatrix Hb2 both are smaller than the number of columns of the base matrix Hb, and the upper-left submatrix Hb1 is an upper-left submatrix of the upper-left submatrix Hb2.

In an embodiment, the upper-left submatrix Hb1 consists of an intersection of the first L0 rows and the first Kb+4 columns of the matrix Hb, the number of entries corresponding to a Z×Z non-zero square matrix in each row of the upper-left submatrix Hb1 is less than or equal to Kb+2 and greater than or equal to Kb−2, and a square matrix including the last four columns of the upper-left submatrix Hb1 is a lower-left triangular matrix or a quasi-lower-left triangular matrix.

And/or the upper-left submatrix Hb2 consists of an intersection of the first Kb rows and the first 2×Kb columns of the matrix Hb, each entry in a submatrix consisting of an intersection of the first 4 rows and the last Kb−4 columns of the upper-left submatrix Hb2 corresponds to a Z×Z zero square matrix, a submatrix consisting of an intersection of the last Kb−4 rows and the last Kb−4 columns of the upper-left submatrix Hb2 is an (Kb−4)×(Kb−4) lower-left triangular matrix or quasi-lower-left triangular matrix, and each entry in a submatrix consisting of an intersection of the last Kb−4 rows and the (Kb+1)-th to (Kb+3)-th columns of the upper-left submatrix Hb2 corresponds to the Z×Z zero square matrix.

When the square matrix including the last four columns of the upper-left submatrix Hb1 is a lower triangular matrix, only one entry in an (Kb+1)-th column of the upper-left submatrix Hb2 corresponds to the Z×Z non-zero square matrix. When the square matrix including the last four columns of the upper-left submatrix Hb1 is a quasi-lower triangular matrix, each entry in the (Kb+1)-th column of the upper-left submatrix Hb2 corresponds to the Z×Z zero square matrix.

The number of entries corresponding to the Z×Z non-zero square matrix in each row of a submatrix consisting of an intersection of the last Kb−4 rows and the first Kb columns of the upper-left submatrix Hb2 is less than or equal to Kb−2.

Nb is greater than or equal to 2×Kb and L0 is equal to 4 or 3.

(2) An expansion factor Z supports a set of determined values $\{z_1, z_2, z_3, \ldots, z_V\}$, where $z_1, z_2, \ldots, z_V$ are arranged in an ascending order, and $z_r$, $z_s$, $z_t$, $z_u$ are four expansion factors in the set of the determined values and satisfy $z_1 \le z_r \le z_s \le z_t \le z_u \le z_V$, where V, r, s, t and u are subscripts, $1 \le r \le s \le t \le u \le V$, and V is an integer greater than or equal to 2.

In a case where $z_1 \le Z = z_i < z_r$, for the LDPC code corresponding to the expansion factor $Z = z_i$ and the base matrix Hb, at least one bit of codeword bits having a weight greater than 2 in each LDPC codeword has a girth equal to 4; and for the LDPC code corresponding to the expansion factor $Z = z_i$ and the base matrix Hb with heaviest R columns deleted, all codeword bits having a weight greater than 2 in each LDPC codeword have a girth equal to 6, where R is less than or equal to Kb/2.

In a case where $z_r \le Z = z_i < z_s$, for the LDPC code corresponding to the expansion factor $Z = z_i$ and the base matrix Hb, all codeword bits having a weight greater than 2 in each LDPC codeword have a girth equal to 6.

In a case where $z_s \le Z = z_i < z_t$, for the LDPC code corresponding to the expansion factor $Z = z_i$ and the base matrix Hb, all systematic bits having a weight greater than 2 in each LDPC codeword have a girth equal to 6 and at least one parity bit having a weight greater than 2 in each LDPC codeword has a girth greater than or equal to 8.

In a case where $z_t \le Z = z_i < z_u$, for the LDPC code corresponding to the expansion factor $Z = z_i$ and the base matrix Hb, all codeword bits having a weight greater than 2 in each LDPC codeword have a girth equal to 8.

In a case where $z_u \le Z = z_i < z_V$, for the LDPC code corresponding to the expansion factor $Z = z_i$ and the base matrix Hb, all systematic bits having a weight greater than 2 in each LDPC codeword have a girth equal to 8 and at least one parity bit having a weight greater than 2 in each LDPC codeword has a girth greater than or equal to 10.

Each codeword bit of one LDPC codeword corresponds to a respective column of a parity check matrix, a weight of the each codeword bit refers to the number of non-zero entries in the respective column of the parity check matrix, and i=1, 2, . . . , V.

Each codeword bit of one LDPC codeword corresponds to a respective column of a parity check matrix, a weight of the each codeword bit refers to the number of non-zero entries in the respective column of the parity check matrix, and here i=1, 2, . . . , V.

An LDPC encoding operation is performed on a source information bit sequence of (Nb−Mb)×Z bits according to the base matrix Hb and the expansion factor Z corresponding to the base matrix Hb to obtain a codeword sequence of Nb×Z bits, where Z is the expansion factor and a positive integer greater than or equal to 1.

In an embodiment, the base matrix Hb further includes an upper-left submatrix Hb3.

In an embodiment, the upper-left submatrix Hb3 consists of an intersection of the first 2×Kb rows and the first 3×Kb columns of the base matrix Hb, and a submatrix consisting of an intersection of the last Kb rows and the last Kb columns of the upper-left submatrix Hb3 is an Kb×Kb identity matrix or a cyclic shift matrix of the identity matrix.

Each entry in a submatrix consisting of an intersection of the first Kb rows and the last Kb columns of the upper-left submatrix Hb3 corresponds to the Z×Z zero square matrix.

The (Kb+1)-th to 2×Kb-th columns of the upper-left submatrix Hb3 constitute a submatrix where only one entry in each column of L1 columns corresponds to a non-zero square matrix, and each entry in remaining Kb−L1 columns corresponds to the Z×Z zero square matrix, where L1 is an integer greater than or equal to 0 and less than Kb.

Nb is greater than or equal to 3×Kb and L0 is equal to 4 or 3.

In an embodiment, Nb is a determined positive integer between 2×Kb and 12×Kb.

In an embodiment, Kb is an integer between 2 and 16.

Furthermore, different Kb values are used in an eMMB scenario and in a URLLC scenario.

In an embodiment, in the base matrix Hb, the number of entries corresponding to a Z×Z non-zero square matrix in a g-th row is less than or equal to the number of entries corresponding to the Z×Z non-zero square matrix in a (g+1)-th row, where g=1, 2, . . . , Mb−1.

In an embodiment, the number of entries corresponding to the non-zero square matrix in a j-th column of the base matrix Hb is Lj and a first entry from top to bottom is 0; where Lj is a positive integer greater than or equal to 1 and j=1, . . . , Nb.

The number of entries corresponding to the non-zero square matrix in the j-th column of the base matrix Hb is Lj and the first entry from top to bottom is 0; where Lj is a positive integer greater than or equal to 1 and j=1, . . . , Nb.

The processor 402 is configured to perform an LDPC decoding operation on a codeword of Nb×z bits to obtain information data of (Nb−Mb)×z bits according to the base matrix Hb and the expansion factor z.

A more specific example is given below. The base matrix Hb satisfying the above requirements is shown in FIG. 3.

For the base matrix Hb shown in FIG. 3, a code rate is ⅓, Mb=16 and Nb=24. Hb1 is a 4×12 matrix, Hb2 is an 8×16 matrix, and Hb3 is a 16×24 matrix. The expansion factor corresponding to the base matrix Hb is z=336. The matrix in FIG. 3 satisfies the characteristics of Hb1, Hb2 and Hb3 at the same time. When the characteristics of Hb1 are satisfied, the LDPC code with a code rate 2/3 has performance close to the turbo code, and the matrix has only 4 rows to provide ultra-high-speed processing. The satisfaction of the characteristics of Hb2 guarantees a preferred degree distribution of the LDPC code and that a specific TBS=336×8 (the girth value is 8) is satisfied to enable the LDPC code with a code rate ½ to achieve performance close to the turbo code. The matrix Hb2 has only 8 rows to provide ultra-high-speed processing. In addition, Hb1 is an upper-left submatrix of Hb2, and the nested structure may support an incremental redundancy HARQ. In an embodiment, the satisfaction of the characteristics of Hb3 guarantees a preferred degree distribution of the LDPC code and that a specific TBS=336×8 (the girth value is 8) is satisfied to enable the LDPC code with a code rate ⅓ to achieve performance close to the turbo code. The matrix Hb3 has only 16 rows to provide ultra-high-speed processing. In addition, Hb1 and Hb2 are both an upper-left submatrix of Hb, and the nested structure may support the incremental redundancy HARQ.

Therefore, the structure in the present disclosure may support high or relatively flexible parallelism and provide ultra-high-speed decoding, thereby achieving Gbps-level decoding. In this embodiment, LDPC decoding is performed on information bits based on the structure of the provided base matrix and an LDPC decoder receives an LDPC codeword. The base matrix has a very small number of rows so that the LDPC decoder may improve a speed of decoding pipelines, that is, improve its processing speed, thereby effectively improving efficiency of the LDPC code and increasing a decoding speed. Furthermore, the base matrix structure provided by the present disclosure may reduce switched networks and hardware complexity by omitting the use of a cyclic shift inverse network (for write and storage).

Embodiment 3

Figure 5:
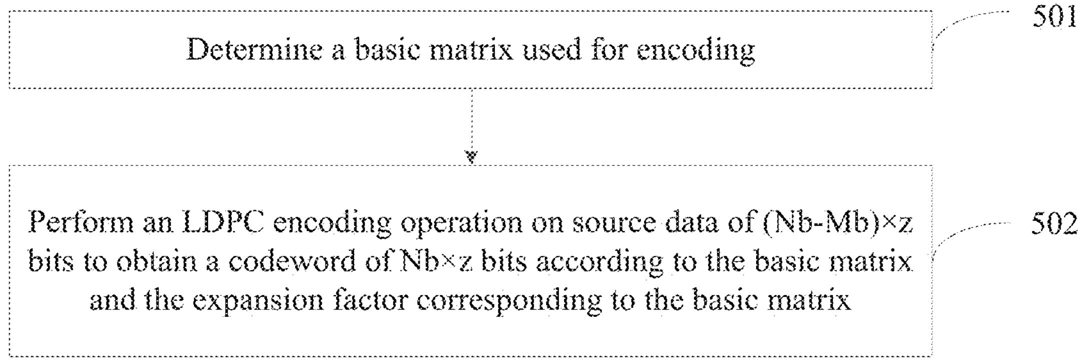
FIG. 5 is a flowchart of an encoding method for a structured LDPC code according to an embodiment 3 of the present disclosure.

The embodiments of the present disclosure provide an encoding method for a structured LDPC code. A flow of using this method for LDPC encoding is shown in FIG. 5. The method includes the steps described below.

In step 501, a base matrix Hb used for encoding is determined.

In an embodiment, the base matrix Hb has the characteristics described below.

The base matrix includes an Mb×Kb block A corresponding to a plurality of systematic bits and an Mb×Mb block B corresponding to a plurality of parity bits to have Hb=[A, B], and $hb_{ij}$ denotes an entry in an i-th row and a j-th column of the base matrix Hb, where i is a row index of the base matrix Hb, j is a column index of the base matrix Hb, where Kb=Nb−Mb, Kb is an integer greater than or equal to 4, Nb is an integer, i=1, . . . , Mb and j=1, . . . , Nb.

In an embodiment, the base matrix Hb further includes at least the following characteristic: The base matrix Hb includes multiple submatrices, the submatrices include an upper-left submatrix Hb1 and an upper-left submatrix Hb2. The number of rows of the upper-left submatrix Hb1 and the number of rows of the upper-left submatrix Hb2 both are smaller than the number of rows of the base matrix Hb, a numbers of columns of the upper-left submatrix Hb1 and the number of columns of the upper-left submatrix Hb2 both are smaller than the number of columns of the base matrix Hb, and the upper-left submatrix Hb1 is an upper-left submatrix of the upper-left submatrix Hb2. In an embodiment, the above characteristic may, but may not necessarily, be implemented in the following manners:

The upper-left submatrix Hb1 consists of an intersection of the first L0 rows and the first Kb+4 columns of the matrix Hb, the number of entries corresponding to a Z×Z non-zero square matrix in each row of the upper-left submatrix Hb1 is less than or equal to Kb+2 and greater than or equal to Kb−2, and a square matrix including the last four columns of the upper-left submatrix Hb1 is a lower-left triangular matrix or a quasi-lower-left triangular matrix.

And/or the upper-left submatrix Hb2 consists of an intersection of the first Kb rows and the first 2×Kb columns of the matrix Hb, each entry in a submatrix consisting of an intersection of the first 4 rows and the last Kb−4 columns of the upper-left submatrix Hb2 corresponds to a Z×Z zero square matrix, a submatrix consisting of an intersection of the last Kb−4 rows and the last Kb−4 columns of the upper-left submatrix Hb2 is an (Kb−4)×(Kb−4) lower-left triangular matrix or quasi-lower-left triangular matrix, and each entry in a submatrix consisting of an intersection of the last Kb−4 rows and the (Kb+1)-th to (Kb+3)-th columns of the upper-left submatrix Hb2 corresponds to the Z×Z zero square matrix.

When the square matrix including the last four columns of the upper-left submatrix Hb1 is a lower triangular matrix, only one entry in an (Kb+1)-th column of the upper-left submatrix Hb2 corresponds to the Z×Z non-zero square matrix. When the square matrix including the last four columns of the upper-left submatrix Hb1 is a quasi-lower triangular matrix, each entry in the (Kb+1)-th column of the upper-left submatrix Hb2 corresponds to the Z×Z zero square matrix.

The number of entries corresponding to the Z×Z non-zero square matrix in each row of a submatrix consisting of an intersection of the last Kb−4 rows and the first Kb columns of the upper-left submatrix Hb2 is less than or equal to Kb−2.

Nb is greater than or equal to 2×Kb and L0 is equal to 4 or 3.

(2) An expansion factor Z supports a set of determined values {z1, z2, z3, . . . , zV}, where z1, z2, . . . , zV are arranged in an ascending order, and zr, zs, zt, zu are four expansion factors in the set of the determined values and satisfy z1≤zr≤zs≤zt≤zu≤zV, where V, r, s, t and u are subscripts, 1≤r≤s≤t≤u≤V, and V is an integer greater than or equal to 2.

In a case where z1≤Z=zi<zr, for the LDPC code corresponding to the expansion factor Z=zi and the base matrix Hb, at least one bit of codeword bits having a weight greater than 2 in each LDPC codeword has a girth equal to 4; and for the LDPC code corresponding to the expansion factor Z=zi and the base matrix Hb with heaviest R columns deleted, all codeword bits having a weight greater than 2 in each LDPC codeword have a girth equal to 6, where R is less than or equal to Kb/2.

In a case where zr≤Z=zi<zs, for the LDPC code corresponding to the expansion factor Z=zi and the base matrix Hb, all codeword bits having a weight greater than 2 in each LDPC codeword have a girth equal to 6.

In a case where zs≤Z=zi<zt, for the LDPC code corresponding to the expansion factor Z=zi and the base matrix Hb, all systematic bits having a weight greater than 2 in each LDPC codeword have a girth equal to 6 and at least one parity bit having a weight greater than 2 in each LDPC codeword has a girth greater than or equal to 8.

In a case where zt≤Z=zi<zu, for the LDPC code corresponding to the expansion factor Z=zi and the base matrix Hb, all codeword bits having a weight greater than 2 in each LDPC codeword have a girth equal to 8.

In a case where zu≤Z=zi<zV, for the LDPC code corresponding to the expansion factor Z=zi and the base matrix Hb, all systematic bits having a weight greater than 2 in each LDPC codeword have a girth equal to 8 and at least one parity bit having a weight greater than 2 in each LDPC codeword has a girth greater than or equal to 10.

Each codeword bit of one LDPC codeword corresponds to a respective column of a parity check matrix, a weight of the each codeword bit refers to the number of non-zero entries in the respective column of the parity check matrix, and i=1, 2, . . . , V.

An LDPC encoding operation is performed on a source information bit sequence of (Nb−Mb)×Z bits according to the base matrix Hb and the expansion factor Z corresponding to the base matrix Hb to obtain a codeword sequence of Nb×Z bits, where Z is the expansion factor and a positive integer greater than or equal to 1.

A more specific example is given below to illustrate a characteristic (2).

The base matrix Hb for the structured LDPC code with a code rate ⅓ is defined as follows:

$$Hb = \begin{matrix}
0 & 0 & 0 & 0 & 0 & 0 & 0 & 0 & 0 & -1 & -1 & -1 & -1 & -1 & -1 & -1 & -1 & -1 & -1 & -1 & -1 & -1 & -1 & -1 \\
928 & 126 & 306 & 105 & 952 & 352 & 36 & 486 & 860 & 0 & -1 & -1 & -1 & -1 & -1 & -1 & -1 & -1 & -1 & -1 & -1 & -1 & -1 & -1 \\
335 & 52 & 262 & 876 & 690 & 996 & 502 & 742 & -1 & 561 & 0 & -1 & -1 & -1 & -1 & -1 & -1 & -1 & -1 & -1 & -1 & -1 & -1 & -1 \\
256 & 726 & 865 & 570 & 530 & 138 & 946 & 44 & -1 & -1 & 911 & 0 & -1 & -1 & -1 & -1 & -1 & -1 & -1 & -1 & -1 & -1 & -1 & -1 \\
910 & 310 & 928 & -1 & 40 & -1 & 396 & -1 & -1 & -1 & -1 & 544 & 0 & -1 & -1 & -1 & -1 & -1 & -1 & -1 & -1 & -1 & -1 & -1 \\
280 & 876 & 418 & -1 & -1 & 365 & -1 & -1 & -1 & -1 & -1 & -1 & -1 & 0 & -1 & -1 & -1 & -1 & -1 & -1 & -1 & -1 & -1 & -1 \\
8 & 660 & -1 & 442 & -1 & 814 & -1 & -1 & -1 & -1 & -1 & -1 & -1 & -1 & 0 & -1 & -1 & -1 & -1 & -1 & -1 & -1 & -1 & -1 \\
438 & 646 & -1 & 772 & 30 & -1 & 257 & -1 & -1 & -1 & -1 & -1 & -1 & -1 & -1 & 0 & -1 & -1 & -1 & -1 & -1 & -1 & -1 & -1 \\
420 & 768 & -1 & -1 & -1 & 330 & -1 & -1 & 609 & -1 & -1 & -1 & -1 & -1 & -1 & -1 & 0 & -1 & -1 & -1 & -1 & -1 & -1 & -1 \\
136 & 936 & -1 & -1 & -1 & -1 & -1 & -1 & -1 & 71 & -1 & -1 & -1 & -1 & -1 & -1 & -1 & 0 & -1 & -1 & -1 & -1 & -1 & -1 \\
148 & 40 & 382 & -1 & -1 & -1 & -1 & -1 & -1 & -1 & 284 & -1 & -1 & -1 & -1 & -1 & -1 & -1 & 0 & -1 & -1 & -1 & -1 & -1 \\
486 & 928 & -1 & 399 & -1 & -1 & -1 & -1 & -1 & -1 & -1 & -1 & -1 & -1 & -1 & -1 & -1 & -1 & -1 & 0 & -1 & -1 & -1 & -1 \\
781 & 400 & -1 & -1 & 618 & -1 & 296 & -1 & -1 & -1 & -1 & -1 & -1 & -1 & -1 & -1 & -1 & -1 & -1 & -1 & 0 & -1 & -1 & -1 \\
290 & 606 & -1 & -1 & -1 & 418 & -1 & 748 & -1 & -1 & -1 & -1 & -1 & -1 & -1 & -1 & -1 & -1 & -1 & -1 & -1 & 0 & -1 & -1 \\
502 & 420 & -1 & -1 & -1 & -1 & 705 & -1 & -1 & -1 & -1 & -1 & -1 & -1 & -1 & -1 & -1 & -1 & -1 & -1 & -1 & -1 & 0 & -1 \\
756 & 100 & -1 & -1 & -1 & -1 & -1 & 977 & -1 & -1 & -1 & -1 & -1 & -1 & -1 & -1 & -1 & -1 & -1 & -1 & -1 & -1 & -1 & 0
\end{matrix}$$

The expansion factor for the LDPC code supports a set of determined values $\{z_1, z_2, z_3, \ldots, z_V\}=\{13, 50, 125, 250, 500, 750, 1000\}$, where V=7 and Zmax=1000. The base matrix Hb(zi) corresponding to each expansion factor is obtained using a scale and floor algorithm in the background.

In the case where r=2 and $z_1=13\le Z=z_i<z_2=50$, for the LDPC code corresponding to the expansion factor $Z=z_i$ and the base matrix Hb, the 13×5=65 bit of all codeword bits having a weight greater than 2 in each LDPC codeword has a girth equal to 4; and for the LDPC code corresponding to the expansion factor Z=zi and the base matrix Hb with heaviest R=8 columns deleted, all codeword bits having a weight greater than 2 in each LDPC codeword have a girth equal to 6, where R is less than or equal to Kb/2.

In the case where s=3 and z2≤Z=zi<z3, for the LDPC code corresponding to the expansion factor Z=zi and the base matrix Hb, all codeword bits having a weight greater than 2 in each LDPC codeword have a girth equal to 6.

In the case where t=4 and zs≤Z=zi<zt, for the LDPC code corresponding to the expansion factor Z=zi and the base matrix Hb, all systematic bits having a weight greater than 2 in each LDPC codeword have a girth equal to 6 and 125 parity bits having a weight greater than 2 in each LDPC codeword have a girth greater than or equal to 8.

In the case where u=7 and zt≤Z=zi<zu, for the LDPC code corresponding to the expansion factor Z=zi and the base matrix Hb, all codeword bits having a weight greater than 2 in each LDPC codeword have a girth equal to 8.

In the case where u=7 and V=7, zu≤Z=zi<zV is null and it indicates that this case does not exist.

Furthermore, the base matrix Hb further has the following characteristics: The upper-left submatrix Hb3 consists of an intersection of the first 2×Kb rows and the first 3×Kb columns of the base matrix Hb, and a submatrix consisting of an intersection of the last Kb rows and the last Kb columns of the upper-left submatrix Hb3 is an Kb×Kb identity matrix or a cyclic shift matrix of the identity matrix.

Each entry in a submatrix consisting of an intersection of the first Kb rows and the last Kb columns of the upper-left submatrix Hb3 corresponds to the Z×Z zero square matrix.

The (Kb+1)-th to 2×Kb-th columns of the upper-left submatrix Hb3 constitute a submatrix where only one entry in each column of L1 columns corresponds to a non-zero square matrix, and each entry in remaining Kb−L1 columns corresponds to the Z×Z zero square matrix, where L1 is an integer greater than or equal to 0 and less than Kb.

Nb is greater than or equal to 3×Kb.

In an embodiment, Nb is a determined positive integer between 2×Kb and 12×Kb.

In an embodiment, Kb is an integer between 2 and 16.

Furthermore, different Kb values are used in an eMMB scenario and in a URLLC scenario.

In an embodiment, in the base matrix Hb, the number of entries corresponding to a Z×Z non-zero square matrix in a g-th row is less than or equal to the number of entries corresponding to the Z×Z non-zero square matrix in a (g+1)-th row, where g=1, 2, . . . , Mb−1.

In an embodiment, the number of entries corresponding to a non-zero square matrix in a j-th column of the base matrix Hb is Lj and a first entry from top to bottom is 0; where Lj is a positive integer greater than or equal to 1 and j=1, . . . , Nb.

The number of entries corresponding to the non-zero square matrix in the j-th column of the base matrix Hb is Lj and the first entry from top to bottom is 0; where Lj is a positive integer greater than or equal to 1 and j=1, . . . , Nb.

In step 502, an LDPC encoding operation is performed on source data of (Nb−Mb)×z bits to obtain a codeword of Nb×z bits according to the base matrix Hb and the expansion factor corresponding to the base matrix Hb.

z is the expansion factor and a positive integer greater than or equal to 1.

Embodiment 4

Figure 6:
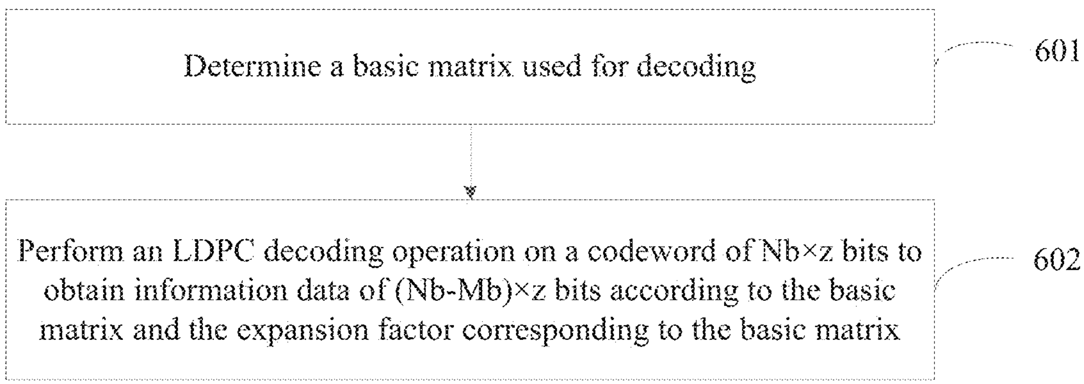
FIG. 6 is a flowchart of a decoding method for a structured LDPC code according to an embodiment 4 of the present disclosure.

The embodiments of the present disclosure provide a decoding method for a structured LDPC code. A flow of using this method for LDPC encoding is shown in FIG. 6. The method includes the steps described below.

In step 601, a base matrix used for decoding is determined.

The base matrix Hb includes multiple submatrices, the submatrices include an upper-left submatrix Hb1 and an upper-left submatrix Hb2. The number of rows of the upper-left submatrix Hb1 and the number of rows of the upper-left submatrix Hb2 both are smaller than the number of rows of the base matrix Hb, a numbers of columns of the upper-left submatrix Hb1 and the number of columns of the upper-left submatrix Hb2 both are smaller than the number of columns of the base matrix Hb, and the upper-left submatrix Hb1 is an upper-left submatrix of the upper-left submatrix Hb2.

The base matrix has the characteristics described below.

A decoding operation is performed on a codeword of a preset number of bits according to the base matrix Hb and an expansion factor Z corresponding to the base matrix Hb to obtain a source information bit sequence, where Z is a positive integer greater than or equal to 1. The base matrix includes an Mb×Kb block A corresponding to a plurality of systematic bits and an Mb×Mb block B corresponding to a plurality of parity bits to have Hb=[A, B], and $hb_{ij}$ denotes an entry in an i-th row and a j-th column of the base matrix Hb, where i is a row index of the base matrix Hb, j is a column index of the base matrix Hb, where Kb=Nb−Mb, Kb is an integer greater than or equal to 4, Nb is an integer, i=1, . . . , Mb and j=1, . . . , Nb.

The base matrix Hb further includes at least one of the characteristics described below.

The upper-left submatrix Hb1 consists of an intersection of the first L0 rows and the first Kb+4 columns of the matrix Hb, the number of entries corresponding to a Z×Z non-zero square matrix in each row of the upper-left submatrix Hb1 is less than or equal to Kb+2 and greater than or equal to Kb−2, and a square matrix including the last four columns of the upper-left submatrix Hb1 is a lower-left triangular matrix or a quasi-lower-left triangular matrix.

And/or the upper-left submatrix Hb2 consists of an intersection of the first Kb rows and the first 2×Kb columns of the matrix Hb, each entry in a submatrix consisting of an intersection of the first 4 rows and the last Kb−4 columns of the upper-left submatrix Hb2 corresponds to a Z×Z zero square matrix, a submatrix consisting of an intersection of the last Kb−4 rows and the last Kb−4 columns of the upper-left submatrix Hb2 is an (Kb−4)×(Kb−4) lower-left triangular matrix or quasi-lower-left triangular matrix, and each entry in a submatrix consisting of an intersection of the last Kb−4 rows and the (Kb+1)-th to (Kb+3)-th columns of the upper-left submatrix Hb2 corresponds to the Z×Z zero square matrix.

When the square matrix including the last four columns of the upper-left submatrix Hb1 is a lower triangular matrix, only one entry in an (Kb+1)-th column of the upper-left submatrix Hb2 corresponds to the Z×Z non-zero square matrix. When the square matrix including the last four columns of the upper-left submatrix Hb1 is a quasi-lower triangular matrix, each entry in the (Kb+1)-th column of the upper-left submatrix Hb2 corresponds to the Z×Z zero square matrix.

The number of entries corresponding to the Z×Z non-zero square matrix in each row of a submatrix consisting of an intersection of the last Kb−4 rows and the first Kb columns of the upper-left submatrix Hb2 is less than or equal to Kb−2.

Nb is greater than or equal to 2×Kb and L0 is equal to 4 or 3.

(2) An expansion factor Z supports a set of determined values {z1, z2, z3, . . . , zV}, where z1, z2, . . . , zV are arranged in an ascending order, and zr, zs, zt, zu are four expansion factors in the set of the determined values and satisfy z1≤zr≤zs≤zt≤zu≤zV, where V, r, s, t and u are subscripts, 1≤r≤s≤t≤u≤V, and V is an integer greater than or equal to 2.

In a case where z1≤Z=zi<zr, for the LDPC code corresponding to the expansion factor Z=zi and the base matrix Hb, at least one bit of codeword bits having a weight greater than 2 in each LDPC codeword has a girth equal to 4; and for the LDPC code corresponding to the expansion factor Z=zi and the base matrix Hb with heaviest R columns deleted, all codeword bits having a weight greater than 2 in each LDPC codeword have a girth equal to 6, where R is less than or equal to Kb/2.

In a case where zr≤Z=zi<zs, for the LDPC code corresponding to the expansion factor Z=zi and the base matrix Hb, all codeword bits having a weight greater than 2 in each LDPC codeword have a girth equal to 6.

In a case where zs≤Z=zi<zt, for the LDPC code corresponding to the expansion factor Z=zi and the base matrix Hb, all systematic bits having a weight greater than 2 in each LDPC codeword have a girth equal to 6 and at least one parity bit having a weight greater than 2 in each LDPC codeword has a girth greater than or equal to 8.

In a case where zt≤Z=zi<zu, for the LDPC code corresponding to the expansion factor Z=zi and the base matrix Hb, all codeword bits having a weight greater than 2 in each LDPC codeword have a girth equal to 8.

In a case where zu≤Z=zi<zV, for the LDPC code corresponding to the expansion factor Z=zi and the base matrix Hb, all systematic bits having a weight greater than 2 in each LDPC codeword have a girth equal to 8 and at least one parity bit having a weight greater than 2 in each LDPC codeword has a girth greater than or equal to 10.

Each codeword bit of one LDPC codeword corresponds to a respective column of a parity check matrix, a weight of the each codeword bit refers to the number of non-zero entries in the respective column of the parity check matrix, and i=1, 2, . . . , V.

An LDPC encoding operation is performed on a source information bit sequence of (Nb−Mb)×Z bits according to the base matrix Hb and the expansion factor Z corresponding to the base matrix Hb to obtain a codeword sequence of Nb×Z bits, where Z is the expansion factor and a positive integer greater than or equal to 1.

In an embodiment, the encoding method for the structured LDPC code further includes the technical characteristics described below.

The upper-left submatrix Hb3 consists of an intersection of the first 2×Kb rows and the first 3×Kb columns of the base matrix Hb, and a submatrix consisting of an intersection of the last Kb rows and the last Kb columns of the upper-left submatrix Hb3 is an Kb×Kb identity matrix or a cyclic shift matrix of the identity matrix.

Each entry in a submatrix consisting of an intersection of the first Kb rows and the last Kb columns of the upper-left submatrix Hb3 corresponds to the Z×Z zero square matrix.

The (Kb+1)-th to 2×Kb-th columns of the upper-left submatrix Hb3 constitute a submatrix where only one entry in each column of L1 columns corresponds to a non-zero square matrix, and each entry in remaining Kb−L1 columns corresponds to the Z×Z zero square matrix, where L1 is an integer greater than or equal to 0 and less than Kb.

Nb is greater than or equal to 3×Kb.

In an embodiment, Nb is a determined positive integer between 2×Kb and 12×Kb.

In an embodiment, Kb is an integer between 2 and 16.

Furthermore, Kb has different values in an eMMB scenario and in a URLLC scenario.

In an embodiment, in the base matrix Hb, the number of entries corresponding to a Z×Z non-zero square matrix in a g-th row is less than or equal to the number of entries corresponding to the Z×Z non-zero square matrix in a (g+1)-th row, where g=1, 2, . . . , Mb−1.

In an embodiment, the number of entries corresponding to the non-zero square matrix in a j-th column of the base matrix Hb is Lj and a first entry from top to bottom is 0; where Lj is a positive integer greater than or equal to 1 and j=1, . . . , Nb.

The number of entries corresponding to the non-zero square matrix in the j-th column of the base matrix Hb is Lj and the first entry from top to bottom is 0; where Lj is a positive integer greater than or equal to 1 and j=1, . . . , Nb.

In step 602, an LDPC decoding operation is performed on a codeword of Nb×z bits to obtain information data of (Nb−Mb)×z bits according to the base matrix Hb and the expansion factor corresponding to the base matrix Hb.

z is the expansion factor and a positive integer greater than or equal to 1.

Embodiment 5

Figure 7:
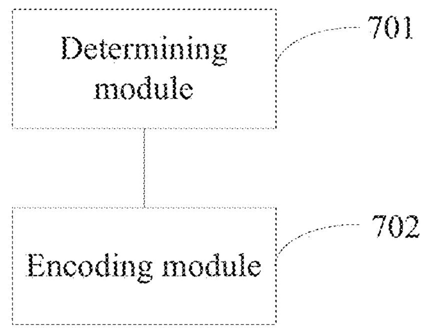
FIG. 7 is a structural diagram of an encoding device for a structured LDPC code according to an embodiment 5 of the present disclosure.

The embodiments of the present disclosure provide an encoding device for a structured LDPC code. As shown in FIG. 7, the encoding device includes a determining module 701 and an encoding module 702.

The determining module 701 is configured to determine a base matrix used for encoding. The base matrix has the characteristics described below.

The base matrix includes an Mb×Kb block A corresponding to a plurality of systematic bits and an Mb×Mb block B corresponding to a plurality of parity bits to have Hb=[A, B], and $hb_{ij}$ denotes an entry in an i-th row and a j-th column of the base matrix Hb, where i is a row index of the base matrix Hb, j is a column index of the base matrix Hb, where Kb=Nb−Mb, Nb is an integer, Kb is an integer greater than or equal to 4, i=1, . . . , Mb and j=1, . . . , Nb.

The base matrix Hb includes multiple submatrices, the submatrices include an upper-left submatrix Hb1 and an upper-left submatrix Hb2. The number of rows of the upper-left submatrix Hb1 and the number of rows of the upper-left submatrix Hb2 both are smaller than the number of rows of the base matrix Hb, a numbers of columns of the upper-left submatrix Hb1 and the number of columns of the upper-left submatrix Hb2 both are smaller than the number of columns of the base matrix Hb, and the upper-left submatrix Hb1 is an upper-left submatrix of the upper-left submatrix Hb2. It means that the base matrix Hb includes at least one of the characteristics described below.

The upper-left submatrix Hb1 consists of an intersection of the first L0 rows and the first Kb+4 columns of the matrix Hb, the number of entries corresponding to a Z×Z non-zero square matrix in each row of the upper-left submatrix Hb1 is less than or equal to Kb+2 and greater than or equal to Kb−2, and a square matrix including the last four columns of the upper-left submatrix Hb1 is a lower-left triangular matrix or a quasi-lower-left triangular matrix.

And/or the upper-left submatrix Hb2 consists of an intersection of the first Kb rows and the first 2×Kb columns of the matrix Hb, each entry in a submatrix consisting of an intersection of the first 4 rows and the last Kb−4 columns of the upper-left submatrix Hb2 corresponds to a Z×Z zero square matrix, a submatrix consisting of an intersection of the last Kb−4 rows and the last Kb−4 columns of the upper-left submatrix Hb2 is an (Kb−4)×(Kb−4) lower-left triangular matrix or quasi-lower-left triangular matrix, and each entry in a submatrix consisting of an intersection of the last Kb−4 rows and the (Kb+1)-th to (Kb+3)-th columns of the upper-left submatrix Hb2 corresponds to the Z×Z zero square matrix.

When the square matrix including the last four columns of the upper-left submatrix Hb1 is a lower triangular matrix, only one entry in an (Kb+1)-th column of the upper-left submatrix Hb2 corresponds to the Z×Z non-zero square matrix. When the square matrix including the last four columns of the upper-left submatrix Hb1 is a quasi-lower triangular matrix, each entry in the (Kb+1)-th column of the upper-left submatrix Hb2 corresponds to the Z×Z zero square matrix.

The number of entries corresponding to the Z×Z non-zero square matrix in each row of a submatrix consisting of an intersection of the last Kb−4 rows and the first Kb columns of the upper-left submatrix Hb2 is less than or equal to Kb−2.

Nb is greater than or equal to 2×Kb and L0 is equal to 4 or 3.

(2) An expansion factor Z supports a set of determined values {z1, z2, z3, . . . , zV}, where z1, z2, . . . , zV are arranged in an ascending order, and zr, zs, zt, zu are four expansion factors in the set of the determined values and satisfy z1≤zr≤zs≤zt≤zu≤zV, where V, r, s, t and u are subscripts, 1≤r≤s≤t≤u≤V, and V is an integer greater than or equal to 2.

In a case where z1≤Z=zi<zr, for the LDPC code corresponding to the expansion factor Z=zi and the base matrix Hb, at least one bit of codeword bits having a weight greater than 2 in each LDPC codeword has a girth equal to 4; and for the LDPC code corresponding to the expansion factor Z=zi and the base matrix Hb with heaviest R columns deleted, all codeword bits having a weight greater than 2 in each LDPC codeword have a girth equal to 6, where R is less than or equal to Kb/2.

In a case where zr≤Z=zi<zs, for the LDPC code corresponding to the expansion factor Z=zi and the base matrix Hb, all codeword bits having a weight greater than 2 in each LDPC codeword have a girth equal to 6.

In a case where zs≤Z=zi<zt, for the LDPC code corresponding to the expansion factor Z=zi and the base matrix Hb, all systematic bits having a weight greater than 2 in each LDPC codeword have a girth equal to 6 and at least one parity bit having a weight greater than 2 in each LDPC codeword has a girth greater than or equal to 8. In a case where zt≤Z=zi<zu, for the LDPC code corresponding to the expansion factor Z=zi and the base matrix Hb, all codeword bits having a weight greater than 2 in each LDPC codeword have a girth equal to 8.

In a case where zu≤Z=zi<zV, for the LDPC code corresponding to the expansion factor Z=zi and the base matrix Hb, all systematic bits having a weight greater than 2 in each LDPC codeword have a girth equal to 8 and at least one parity bit having a weight greater than 2 in each LDPC codeword has a girth greater than or equal to 10.

Each codeword bit of one LDPC codeword corresponds to a respective column of a parity check matrix, a weight of the each codeword bit refers to the number of non-zero entries in the respective column of the parity check matrix, and i=1, 2, . . . , V.

An LDPC encoding operation is performed on a source information bit sequence of (Nb−Mb)×Z bits according to the base matrix Hb and the expansion factor Z corresponding to the base matrix Hb to obtain a codeword sequence of Nb×Z bits, where Z is the expansion factor and a positive integer greater than or equal to 1.

In an embodiment, the encoding method for the structured LDPC code further includes the technical characteristics described below.

The upper-left submatrix Hb3 consists of an intersection of the first 2×Kb rows and the first 3×Kb columns of the base matrix Hb, and a submatrix consisting of an intersection of the last Kb rows and the last Kb columns of the upper-left submatrix Hb3 is an Kb×Kb identity matrix or a cyclic shift matrix of the identity matrix.

Each entry in a submatrix consisting of an intersection of the first Kb rows and the last Kb columns of the upper-left submatrix Hb3 corresponds to the Z×Z zero square matrix.

The (Kb+1)-th to 2×Kb-th columns of the upper-left submatrix Hb3 constitute a submatrix where only one entry in each column of L1 columns corresponds to a non-zero square matrix, and each entry in remaining Kb−L1 columns corresponds to the Z×Z zero square matrix, where L1 is an integer greater than or equal to 0 and less than Kb.

Nb is greater than or equal to 3×Kb.

In an embodiment, Nb is a determined positive integer between 2×Kb and 12×Kb.

In an embodiment, Kb is an integer between 2 and 16.

Furthermore, Kb has different values in an eMMB scenario and in a URLLC scenario.

In an embodiment, in the base matrix Hb, the number of entries corresponding to a Z×Z non-zero square matrix in a g-th row is less than or equal to the number of entries corresponding to the Z×Z non-zero square matrix in a (g+1)-th row, where g=1, 2, . . . , Mb−1.

In an embodiment, the number of entries corresponding to the non-zero square matrix in a j-th column of the base matrix Hb is Lj and a first entry from top to bottom is 0; where Lj is a positive integer greater than or equal to 1 and j=1, . . . , Nb.

The number of entries corresponding to the non-zero square matrix in the j-th column of the base matrix Hb is Lj and the first entry from top to bottom is 0; where Lj is a positive integer greater than or equal to 1 and j=1, . . . , Nb.

The encoding module 702 is configured to perform an LDPC encoding operation on source data of (Nb−Mb)×z bits according to the base matrix Hb and the expansion factor corresponding to the base matrix Hb to obtain a codeword of Nb×z bits, where z is the expansion factor and a positive integer greater than or equal to 1.

Figure 8:
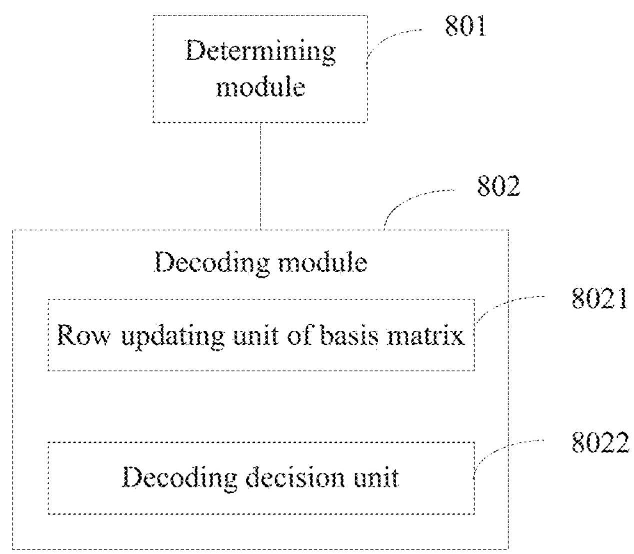
FIG. 8 is a structural diagram of a decoding device for a structured LDPC code according to the embodiment 5 of the present disclosure.

The embodiments of the present disclosure further provide a decoding device for a structured LDPC code. As shown in FIG. 8, the decoding device includes a determining module 801 and a decoding module 802.

The determining module 801 is configured to determine a base matrix used for decoding. The base matrix has the characteristics described below.

The base matrix includes an Mb×Kb block A corresponding to a plurality of systematic bits and an Mb×Mb block B corresponding to a plurality of parity bits to have Hb=[A, B], and $hb_{ij}$ denotes an entry in an i-th row and a j-th column of the base matrix Hb, where i is a row index of the base matrix Hb, j is a column index of the base matrix Hb, where Kb=Nb−Mb, Nb is an integer, Kb is an integer greater than or equal to 4, i=1, . . . , Mb and j=1, . . . , Nb.

The base matrix Hb further includes at least one of the characteristics described below.

The upper-left submatrix Hb1 consists of an intersection of the first L0 rows and the first Kb+4 columns of the matrix Hb, the number of entries corresponding to a Z×Z non-zero square matrix in each row of the upper-left submatrix Hb1 is less than or equal to Kb+2 and greater than or equal to Kb−2, and a square matrix including the last four columns of the upper-left submatrix Hb1 is a lower-left triangular matrix or a quasi-lower-left triangular matrix.

And/or the upper-left submatrix Hb2 consists of an intersection of the first Kb rows and the first 2×Kb columns of the matrix Hb, each entry in a submatrix consisting of an intersection of the first 4 rows and the last Kb−4 columns of the upper-left submatrix Hb2 corresponds to a Z×Z zero square matrix, a submatrix consisting of an intersection of the last Kb−4 rows and the last Kb−4 columns of the upper-left submatrix Hb2 is an (Kb−4)×(Kb−4) lower-left triangular matrix or quasi-lower-left triangular matrix, and each entry in a submatrix consisting of an intersection of the last Kb−4 rows and the (Kb+1)-th to (Kb+3)-th columns of the upper-left submatrix Hb2 corresponds to the Z×Z zero square matrix.

When the square matrix including the last four columns of the upper-left submatrix Hb1 is a lower triangular matrix, only one entry in an (Kb+1)-th column of the upper-left submatrix Hb2 corresponds to the Z×Z non-zero square matrix. When the square matrix including the last four columns of the upper-left submatrix Hb1 is a quasi-lower triangular matrix, each entry in the (Kb+1)-th column of the upper-left submatrix Hb2 corresponds to the Z×Z zero square matrix.

The number of entries corresponding to the Z×Z non-zero square matrix in each row of a submatrix consisting of an intersection of the last Kb−4 rows and the first Kb columns of the upper-left submatrix Hb2 is less than or equal to Kb−2.

Nb is greater than or equal to 2×Kb and L0 is equal to 4 or 3.

(2) An expansion factor Z supports a set of determined values {z1, z2, z3, . . . , zV}, where z1, z2, . . . , zV are arranged in an ascending order, and zr, zs, zt, zu are four expansion factors in the set of the determined values and satisfy z1≤zr≤zs≤zt≤zu≤zV, where V, r, s, t and u are subscripts, 1≤r≤s≤t≤u≤V, and V is an integer greater than or equal to 2.

In a case where z1≤Z=zi<zr, for the LDPC code corresponding to the expansion factor Z=zi and the base matrix Hb, at least one bit of codeword bits having a weight greater than 2 in each LDPC codeword has a girth equal to 4; and for the LDPC code corresponding to the expansion factor Z=zi and the base matrix Hb with heaviest R columns deleted, all codeword bits having a weight greater than 2 in each LDPC codeword have a girth equal to 6, where R is less than or equal to Kb/2.

In a case where zr≤Z=zi<zs, for the LDPC code corresponding to the expansion factor Z=zi and the base matrix Hb, all codeword bits having a weight greater than 2 in each LDPC codeword have a girth equal to 6.

In a case where zs≤Z=zi<zt, for the LDPC code corresponding to the expansion factor Z=zi and the base matrix Hb, all systematic bits having a weight greater than 2 in each LDPC codeword have a girth equal to 6 and at least one parity bit having a weight greater than 2 in each LDPC codeword has a girth greater than or equal to 8.

In a case where zt≤Z=zi<zu, for the LDPC code corresponding to the expansion factor Z=zi and the base matrix Hb, all codeword bits having a weight greater than 2 in each LDPC codeword have a girth equal to 8.

In a case where zu≤Z=zi<zV, for the LDPC code corresponding to the expansion factor Z=zi and the base matrix Hb, all systematic bits having a weight greater than 2 in each LDPC codeword have a girth equal to 8 and at least one parity bit having a weight greater than 2 in each LDPC codeword has a girth greater than or equal to 10.

Each codeword bit of one LDPC codeword corresponds to a respective column of a parity check matrix, a weight of the each codeword bit refers to the number of non-zero entries in the respective column of the parity check matrix, and i=1, 2, . . . , V. An LDPC encoding operation is performed on a source information bit sequence of (Nb−Mb)×Z bits according to the base matrix Hb and the expansion factor Z corresponding to the base matrix Hb to obtain a codeword sequence of Nb×Z bits, where Z is the expansion factor and a positive integer greater than or equal to 1.

In an embodiment, the base matrix Hb further has the characteristics described below.

The upper-left submatrix Hb3 consists of an intersection of the first 2×Kb rows and the first 3×Kb columns of the base matrix Hb, and a submatrix consisting of an intersection of the last Kb rows and the last Kb columns of the upper-left submatrix Hb3 is an Kb×Kb identity matrix or a cyclic shift matrix of the identity matrix.

Each entry in a submatrix consisting of an intersection of the first Kb rows and the last Kb columns of the upper-left submatrix Hb3 corresponds to the Z×Z zero square matrix.

The (Kb+1)-th to 2×Kb-th columns of the upper-left submatrix Hb3 constitute a submatrix where only one entry in each column of L1 columns corresponds to a non-zero square matrix, and each entry in remaining Kb−L1 columns corresponds to the Z×Z zero square matrix, where L1 is an integer greater than or equal to 0 and less than Kb.

Nb is greater than or equal to 3×Kb.

In an embodiment, Nb is a determined positive integer between 2×Kb and 12×Kb.

In an embodiment, Kb is an integer between 2 and 16.

Furthermore, Kb has different values in an eMMB scenario and in a URLLC scenario.

In an embodiment, in the base matrix Hb, the number of entries corresponding to a Z×Z non-zero square matrix in a g-th row is less than or equal to the number of entries corresponding to the Z×Z non-zero square matrix in a (g+1)-th row, where g=1, 2, . . . , Mb−1.

In an embodiment, the number of entries corresponding to the non-zero square matrix in a j-th column of the base matrix Hb is Lj and a first entry from top to bottom is 0; where Lj is a positive integer greater than or equal to 1 and j=1, . . . , Nb.

The number of entries corresponding to the non-zero square matrix in the j-th column of the base matrix Hb is Lj and the first entry from top to bottom is 0; where Lj is a positive integer greater than or equal to 1 and j=1, . . . , Nb.

The decoding module 802 is configured to perform an LDPC decoding operation on a codeword of Nb×z bits according to the base matrix Hb and the expansion factor corresponding to the base matrix Hb to obtain information data of (Nb−Mb)×z bits, where z is the expansion factor and a positive integer greater than or equal to 1.

Preferably, the decoding module 802 includes: a row updating unit 8021 of the base matrix Hb and a decoding decision unit 8022.

The row updating unit 8021 of the base matrix Hb is configured to perform a row update on the base matrix Hb using a layered BP algorithm or a corrected min-sum algorithm.

Edge information is the information from check nodes to variable nodes.

The decoding decision unit 8022 is configured to: calculate a log-likelihood ratio of the codeword using the edge information, perform a hard decision, check whether the codeword is correct, and when the codeword is correct, output the correct codeword, and when the codeword is incorrect, continue a decoding process.

To conclude, the embodiments of the present disclosure provide an encoding method, a decoding method, an encoding device and a decoding device for a structured LDPC code. The base matrix, including a number KO of upper and lower adjacent pairs and used for the encoding or decoding, is determined and encoding or decoding is performed according to the base matrix and the expansion factor corresponding to the base matrix, achieving LDPC encoding and decoding with a high pipeline speed, and increasing efficiency of the codec. The embodiments of the present disclosure may be applied to error correction encoding techniques for data transmission in a digital communication system, to obtain an LDPC code with improved efficiency or reduced complexity. This especially applicable to an ultra-high-speed scenario.

Embodiment 6

The embodiments of the present disclosure further provide a storage medium. In this embodiment, the storage medium described above may be configured to store program codes for executing the steps described below.

A base matrix Hb used for encoding is determined. The base matrix Hb includes an Mb×Kb block A corresponding to a plurality of systematic bits and an Mb×Mb block B corresponding to a plurality of parity bits to have Hb=[A, B], and $hb_{ij}$ denotes an entry in an i-th row and a j-th column of the base matrix Hb, where i is a row index of the base matrix Hb, j is a column index of the base matrix Hb, where Kb=Nb−Mb, Kb is an integer greater than or equal to 4, Nb is an integer, i=1, . . . , Mb and j=1, . . . , Nb. The base matrix Hb includes multiple submatrices, the submatrices include an upper-left submatrix Hb1 and an upper-left submatrix Hb2. The number of rows of the upper-left submatrix Hb1 and the number of rows of the upper-left submatrix Hb2 both are smaller than the number of rows of the base matrix Hb, a numbers of columns of the upper-left submatrix Hb1 and the number of columns of the upper-left submatrix Hb2 both are smaller than the number of columns of the base matrix Hb, and the upper-left submatrix Hb1 is an upper-left submatrix of the upper-left submatrix Hb2. An LDPC encoding operation is performed on a source information bit sequence according to the base matrix Hb and an expansion factor Z corresponding to the base matrix Hb to obtain a codeword sequence, where Z is a positive integer greater than or equal to 1.

In this embodiment, the storage medium may include, but is not limited to, a U disk, a read-only memory (ROM), a random access memory (RAM), a mobile hard disk, a magnetic disk, an optical disk or another medium capable of storing program codes.

Embodiment 7

The embodiments of the present disclosure further provide another storage medium. In this embodiment, the storage medium described above may be configured to store program codes for executing the steps described below.

A base matrix Hb used for decoding is determined. The base matrix includes an Mb×Kb block A corresponding to a plurality of systematic bits and an Mb×Mb block B corresponding to a plurality of parity bits to have Hb=[A, B], and $hb_{ij}$ denotes an entry in an i-th row and a j-th column of the base matrix Hb, where i is a row index of the base matrix Hb, j is a column index of the base matrix Hb, where Kb=Nb−Mb, Kb is an integer greater than or equal to 4, Nb is an integer, i=1, . . . , Mb and j=1, . . . , Nb. The base matrix Hb includes multiple submatrices, the submatrices include an upper-left submatrix Hb1 and an upper-left submatrix Hb2. The number of rows of the upper-left submatrix Hb1 and the number of rows of the upper-left submatrix Hb2 both are smaller than the number of rows of the base matrix Hb, a numbers of columns of the upper-left submatrix Hb1 and the number of columns of the upper-left submatrix Hb2 both are smaller than the number of columns of the base matrix Hb, and the upper-left submatrix Hb1 is an upper-left submatrix of the upper-left submatrix Hb2.

A decoding operation is performed on a codeword of a preset number of bits according to the base matrix Hb and an expansion factor Z corresponding to the base matrix Hb to obtain a source information bit sequence, where Z is a positive integer greater than or equal to 1.

For specific examples in this embodiment, reference may be made to the examples described in the above embodiments and further embodiments, and repetition will not be made in this embodiment.

Embodiment 8

The LDPC code supports V code lengths, each code length corresponds to a base matrix Hb of the same size of Mb×Nb, and entries corresponding to a non-zero square matrix in the base matrix of each code length have same positions or at most 3 different positions in the basis matrix (at most 3 entries corresponding to the non-zero square matrix in the base matrix of each code length have different positions in the base matrix). The expansion factor Z supports a set of determined expansion factors {z1, z2, z3, . . . , zVmax}, the expansion factor of each code length is one entry in the set of expansion factors, and a value of an entry corresponding to the non-zero square matrix of each code length is calculated based on an entry corresponding to the non-zero square matrix of the maximum code length in at least one of the following manners:

Manner 1: A Modulo Manner $$h_{ij}^{v} = \left(\alpha\left[\frac{h_{ij}^{Vmax}}{\alpha}\right]\right) \bmod z_v$$

Manner 2: A Scale and Floor Manner $$h_{ij}^{v} = \left[\alpha\left[\frac{h_{ij}^{Vmax}}{\alpha}\right] \times \frac{z_v}{z_{Vmax}}\right]$$

Manner 3: A Scale and Round Manner $$h_{ij}^{v} = \text{Round}\left(\alpha\left[\frac{h_{ij}^{Vmax}}{\alpha}\right] \times \frac{z_v}{z_{Vmax}}\right)$$

where α=Pmax/Pl, v=1, 2, . . . , Vmax, $z_1$, $z_2$, $z_3$, . . . , $z_{Vmax}$ are arranged in an ascending order, $z_{Vmax}$ is the expansion factor of the maximum code length, $z_v$ is the expansion factor of the v-th code length, $h_{ij}^{Vmax}$ is an entry corresponding the non-zero square matrix in the i-th row and the j-th column of the maximum code length, and $h_{ij}^{v}$ is an entry corresponding the non-zero square matrix in the i-th row and the j-th column of the v-th code length; mod is a modulo operation, [ ] is a floor operation, and Round is a rounding operation. The expansion factor $z_v$ is n times a positive integer pl, z=pl×n. The positive integer pl is one entry of a subset Pset, the subset Pset is a subset of a set consisting of all positive integer factors of Pmax, n is a natural number, and Pmax is an integer greater than or equal to 4.

A more specific example is given here.

Pset is {256, 32}, nset is {1, 3, 5}, and thus Pmax=256. It is known that there are 6 expansion factors, the set of determined expansion factors supported by the expansion factor Z has 6 entries, which means Vmax=6, the set of expansion factors is {32, 96, 160, 256, 768, 1280} and a set of code lengths is {128, 384, 640, 1024, 3072, 5120}. The maximum expansion factor is $z_{vmax}$=1280 and the base matrix $Hb^6$ corresponding to the maximum expansion factor $z_{vmax}$=1280 is given:

| | | | | | | | |
|---|---|---|---|---|---|---|---|
| 905 | 1088 | 710 | 361 | 229 | −1 | −1 | −1 |
| 674 | 55 | 653 | 656 | 73 | 985 | −1 | −1 |
| 277 | 1085 | 1197 | 162 | 460 | 253 | 160 | −1 |
| 460 | 419 | 23 | 7 | 576 | 656 | 951 | 759 |

The value of the entry corresponding to the non-zero square matrix in the base matrix of each code length is calculated based on the entry corresponding to the non-zero square matrix in the base matrix of the maximum code length in three manners. The base matrix of another expansion factor is calculated and obtained in the manner 1 in two steps.

In step 1, a front part of the formula in the manner 1 is calculated as follows:

$$h_{ij}'^{v} = \alpha\left[\frac{h_{ij}^{6}}{\alpha}\right]$$

where $h_{ij}^{6}$ is an entry in the i-th row and the j-th column of the base matrix $Hb^6$ corresponding to the maximum expansion factor $z_{vmax}$=1280 (Vmax=6) α=Pmax/pl, and thus, α has 2 values (the value 1 corresponds to the first entry 256 in Pset and the expansion factors {256, 768, 1280}; and the value 8 corresponds to the second entry 32 in Pset and the expansion factors {32, 96, 160}), and v=1, 2, 3, 4, 5. The base matrix of another expansion factor (less than 1280) calculated according to step 1 includes the following matrices:

The base matrices $Hb'^1$, $Hb'^2$ and $Hb'^3$ of three expansion factors {32, 96, 160} when α is equal to 8 are as follows:

| | | | | | | | |
|---|---|---|---|---|---|---|---|
| 904 | 1088 | 704 | 360 | 224 | −1 | −1 | −1 |
| 672 | 48 | 648 | 656 | 72 | 984 | −1 | −1 |
| 272 | 1080 | 1192 | 160 | 456 | 248 | 160 | −1 |
| 456 | 416 | 16 | 0 | 576 | 664 | 944 | 752 |

The base matrices $Hb'^4$ and $Hb'^5$ of two expansion factors {256, 768} when α is equal to 1 are as follows:

| | | | | | | | |
|---|---|---|---|---|---|---|---|
| 905 | 1088 | 710 | 361 | 229 | −1 | −1 | −1 |
| 674 | 55 | 653 | 656 | 73 | 985 | −1 | −1 |
| 277 | 1085 | 1197 | 162 | 460 | 253 | 160 | −1 |
| 460 | 419 | 23 | 7 | 576 | 666 | 951 | 759 |

Because α is equal to 1, the base matrices $Hb'^4$ and $Hb'^5$ are just the base matrix corresponding to the maximum expansion factor.

In step 2, a latter part of the formula in the manner 1 is calculated as follows:

$$h_{ij}^{v}=(h'^{v}_{ij}) \bmod z,$$

where v=1, 2, 3, 4, 5, $h'^{v}_{ij}$ is an entry in the i-th row and the j-th column of the base matrix $Hb'^{v}$ corresponding to the expansion factor zv, and zv has values {32, 96, 160, 256, 768}. The other five base matrices corresponding to the expansion factors {32, 96, 160, 256, 768} are respectively calculated according to step 2 as follows:

The base matrix $Hb^1$ corresponding to the expansion factor 32 is:

| | | | | | | | |
|---|---|---|---|---|---|---|---|
| 8 | 0 | 0 | 8 | 0 | −1 | −1 | −1 |
| 0 | 16 | 8 | 16 | 8 | 24 | −1 | −1 |
| 16 | 24 | 8 | 0 | 8 | 24 | 0 | −1 |
| 8 | 0 | 16 | 0 | 0 | 24 | 16 | 16 |

The base matrix $Hb^2$ corresponding to the expansion factor 96 is:

| | | | | | | | |
|---|---|---|---|---|---|---|---|
| 40 | 32 | 32 | 72 | 32 | −1 | −1 | −1 |
| 0 | 48 | 72 | 80 | 72 | 24 | −1 | −1 |
| 80 | 24 | 40 | 64 | 72 | 56 | 64 | −1 |
| 72 | 32 | 16 | 0 | 0 | 88 | 80 | 80 |

The base matrix $Hb^3$ corresponding to the expansion factor 160 is:

| | | | | | | | |
|---|---|---|---|---|---|---|---|
| 104 | 128 | 64 | 40 | 64 | −1 | −1 | −1 |
| 32 | 48 | 8 | 16 | 72 | 24 | −1 | −1 |
| 112 | 120 | 72 | 0 | 136 | 88 | 0 | −1 |
| 136 | 96 | 16 | 0 | 96 | 24 | 144 | 112 |

The base matrix $Hb^4$ corresponding to the expansion factor 256 is:

| | | | | | | | |
|---|---|---|---|---|---|---|---|
| 137 | 64 | 198 | 105 | 229 | −1 | −1 | −1 |
| 162 | 55 | 141 | 144 | 73 | 217 | −1 | −1 |
| 21 | 61 | 173 | 162 | 204 | 253 | 160 | −1 |
| 204 | 163 | 23 | 7 | 64 | 154 | 183 | 247 |

The base matrix $Hb^5$ corresponding to the expansion factor 768 is:

| | | | | | | | |
|---|---|---|---|---|---|---|---|
| 136 | 320 | 704 | 360 | 224 | −1 | −1 | −1 |
| 672 | 48 | 648 | 656 | 72 | 216 | −1 | −1 |
| 272 | 312 | 424 | 160 | 456 | 248 | 160 | −1 |
| 456 | 416 | 16 | 0 | 576 | 664 | 176 | 752 |

The manner 1 has beneficial effects that the same decoder may be used for a plurality of code lengths with merely a few control circuits to be added. That is, the LDPC code can support very flexibly code lengths; and it is ensured that the matrix characteristics of the LDPC code have little change from large expansion factors to small expansion factors, thereby making the LDPC code maintain better decoding performance over a larger range of code lengths.

Figure 9:
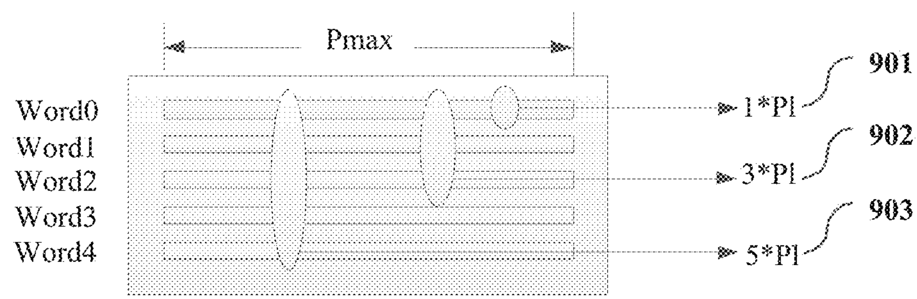
FIG. 9 is a schematic diagram 1 of a storage mode of a memory according to an embodiment 8 of the present disclosure.
Figure 10:
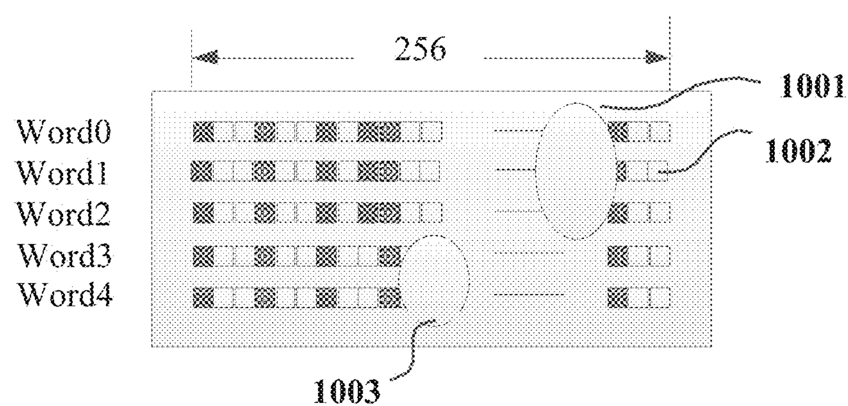
FIG. 10 is a schematic diagram 2 of a storage mode of a memory according to the embodiment 8 of the present disclosure.

For example, according to a design method of the base matrix and expansion factor described above, a design scheme of a memory shown in FIG. 9 may be used for the decoder. FIG. 9 shows a storage mode of information in a certain column of the base matrix of the LDPC code and the storage mode includes the storage mode of external information and channel demodulation information. The maximum value of n is 5, so 5 words are required, such as word0 to word4 as shown in FIG. 9; and Pmax is equal to 256, so the size of each word is 256. A value of Pl corresponding to the expansion factor z used for LDPC encoding corresponds to positions occupied by Pl in each word in a practical decoder. For example, when the value of Pl is 32 from Pset={256, 32}, it means that Pl occupies 32 positions in each word in the practical decoder. If the value of Pl is 256, it means that Pl occupies 256 positions in each word in the practical decoder (because the value of Pl is equal to Pmax, Pl occupies the whole word). The value of n corresponding to the expansion factor z used for LDPC encoding corresponds to the number of words in the practical decoder. For example, when the value of n is 1 from nset={1, 3, 5}, it means that merely one word in the practical decoder is used for storing all z pieces of information in one column of the base matrix; if the value of n is 3 from nset={1, 3, 5}, it means that merely three words in the practical decoder are used for storing all z pieces of information in one column of the base matrix; and if the value of n is 5 from nset={1, 3, 5}, it means that 5 words in the practical decoder are used for storing all z pieces of information in one column of the base matrix. Here, the storage mode for storing all z=96 pieces of information in one column of the base matrix in an LDPC decoder will be described in detail using an example in which the expansion factor is z=96. The expansion factor is z=96, and then l=1, pl=32, and n=3. As described above, if the expansion factor is z=96 in the LDPC encoding, the z=96 pieces of soft information in any column of the base matrix are stored in 32 positions in each of the n=3 words in the decoder. As shown in FIG. 10, any column of the base matrix occupies n=3 words (word0 to word2) in the decoder, such as 1001 in FIG. 10. In each word, p=32 positions are occupied, and each word is occupied from the first position by placing one piece of information every 8 positions. For 1002 in FIG. 10, one piece of information is placed every 8 positions in each word (the information is placed in the first position of the 8 positions). Merely three words are occupied and the rest two words (1003 in FIG. 10) are empty. It can be seen that in the design of the decoder, Pmax may correspond to the maximum size of the word, and the maximum value of n corresponds to the number of words in the memory for storing z (the expansion factor) pieces of information in any column of the base matrix. Since z=96 pieces of information in any column of the base matrix may be stored in one storage block and different words only need to be distinguished by their addresses, information of each word is combined together.

As described above, each piece of information is placed in the corresponding position in the word, and one piece of information is placed every 8 positions in each word. For the expansion factor z=96 (the code length z×Nb=96×8=768), codeword information of a length 768 may be interleaved before the decoding using an interleaving method. The interleaving method is determined by at least one of Pmax, Pl or n. The interleaving method is described below. A codeword information sequence to be decoded includes 768 pieces of information including Nb=8 small data blocks of a length z=96 which are subdivided into subblocks of a length of pl=32. Each subblock is filled with Pmax−pl=256−32=224 dummy bits to obtain the small data blocks of a length 256 to be decoded. The dummy bits are not used in decoding or decoding. All the small data blocks to be decoded are interleaved using a bit reverse order (BRO) interleaving method. The BRO interleaving method is described as follows: converting an index to be interleaved F0 into an 8-bit binary bit sequence and performing a horizontal flip (interchanging the highest bit and the lowest bit, interchanging the second highest bit and the second lowest bit and so on) on the binary bit sequence to obtain the reversed binary sequence. The reversed binary sequence is converted into a decimal value F1, which means an interleaved index is F1 and the formula may be written as Y'F1=YF0, where Y is the small data blocks to be decoded before the interleaving and Y' is the small data blocks to be decoded after the interleaving. For example, F0 has a decimal value of 15, the 8-bit binary sequence is 00001111, the reversed 8-bit binary sequence is 11110000, and F1 has a decimal value of 240. Therefore, in the interleaving process, the value 240 of the interleaved index in Y' is equal to the value 15 of the index to be interleaved in Y. The interleaving method is performed before encoding, and accordingly, an opposite operation (the de-interleaving method) is also performed after encoding to obtain a de-interleaved codeword data sequence. That is, the de-interleaving method is performed from Y'F0=YF1. The de-interleaving method is determined by at least one of Pmax, pl and n. The de-interleaved codeword data sequence is selected to obtain codeword bits. The length of the binary sequence converted from the decimal value is determined by Pmax, where Pmax is a positive integer power of 2 and the positive integer is the length of the binary sequence.

Similarly, in the LDPC decoder, the interleaving and de-interleaving methods described above may also be adopted. A codeword of preset bits is interleaved before it is decoded by the same interleaving method described above. Then the LDPC decoding is performed to obtain a decoded sequence. The decoded sequence is de-interleaved and selected to obtain a source information bit sequence.

It can be seen from the above analysis that the LDPC decoder (with a memory which has 5 words and the size of each word is 256) may support all expansion factors equal to integer values obtained by multiplying all positive integer factors of Pmax by all positive integers less than or equal to 5. In this embodiment, Pmax is 2 to the power of 8. However, Pmax is not limited to a positive integer power of 2 and may be any integer greater than 4.

According to the design method of the base matrix and the expansion factor described above, in the design of the encoder, an LDPC encoding operation is performed on the source information bit sequence to obtain the codeword sequence. The LDPC encoding operation is performed on the source information bit sequence according to the base matrix and the expansion factor Z corresponding to the base matrix Hb to obtain the codeword sequence, where Z is a positive integer greater than or equal to 1.

In the manners 2 and 3 described above, the encoding method, the decoding method, the interleaving method, the de-interleaving method and related algorithms may also be employed. The interleaving method on the encoding side is concluded as follows: dividing information bits to be encoded into a plurality of segments of pl bits; adding Pmax−pl bits at the end of each of the segment to have a plurality of segments of Pmax bits; and performing binary bit reverse order (BRO) interleaving of a length of Pmax on each of the plurality of segments of Pmax bits.

The de-interleaving method on the encoding side is concluded as follows: dividing the encoded codeword bits into a plurality of segments of Pmax bits; and performing binary bit reverse order (BRO) de-interleaving of a length of Pmax on each of the plurality of segments of Pmax bits.

The base matrix of another expansion factor is calculated and obtained in the manner 2 in two steps.

In step 1, a part of the formula in the manner 2 is calculated as follows:

$$h_{ij}^{\prime v} = \alpha\left\lfloor \frac{h_{ij}^{6}}{\alpha} \right\rfloor$$

where $h_{ij}^{6}$ is an entry in the i-th row and the j-th column of the base matrix $Hb^{6}$ corresponding to the maximum expansion factor $z_{vmax}$=1280 (Vmax=6) α=Pmax/pl, and thus α has 2 values (the value 1 corresponds to the first entry 256 in Pset and the expansion factors {256, 768, 1280}; and the value 8 corresponds to the second entry 32 in Pset and the expansion factors {32, 96, 160}), and v=1, 2, 3, 4, 5.

It can be found that the manner 2 has the same step 1 as the manner 1. The base matrix of another expansion factor (less than 1280) calculated according to step 1 in the manner 2 includes the following matrices:

The base matrices $Hb'^{1}$, $Hb'^{2}$ and $Hb'^{3}$ of three expansion factors {32, 96, 160} when α is equal to 8 are as follows:

| | | | | | | | |
|---|---|---|---|---|---|---|---|
| 904 | 1088 | 704 | 360 | 224 | −1 | −1 | −1 |
| 672 | 48 | 648 | 656 | 72 | 984 | −1 | −1 |
| 272 | 1080 | 1192 | 160 | 456 | 248 | 160 | −1 |
| 456 | 416 | 16 | 0 | 576 | 664 | 944 | 752 |

The base matrices $Hb'^{1}$ and $Hb'^{5}$ of two expansion factors {256, 768} when a is equal to 1 are as follows:

| | | | | | | | |
|---|---|---|---|---|---|---|---|
| 905 | 1088 | 710 | 361 | 229 | −1 | −1 | −1 |
| 674 | 55 | 653 | 656 | 73 | 985 | −1 | −1 |
| 277 | 1085 | 1197 | 162 | 460 | 253 | 160 | −1 |
| 460 | 419 | 23 | 7 | 576 | 656 | 951 | 759 |

Because α is equal to 1, the base matrices $Hb'^{4}$ and $Hb'^{5}$ are just the base matrix corresponding to the maximum expansion factor.

In step 2, the rest part of the formula in the manner 2 is calculated as follows:

$$h_{ij}^{v} = \left\lfloor (h_{ij}^{\prime v}) \times \frac{z_v}{z_{Vmax}} \right\rfloor$$

where v=1, 2, 3, 4, 5, $h'^{v}_{ij}$ is an entry in the i-th row and the j-th column of the base matrix $Hb'^{v}$ corresponding to the expansion factor zv, zv has values {32, 96, 160, 256, 768}, and $z_{vmax}$=1280. The other five base matrices corresponding to the expansion factors {32, 96, 160, 256, 768} are respectively calculated according to step 2 as follows:

The base matrix $Hb^1$ corresponding to the expansion factor 32 is:

| 22 | 27 | 17 | 9 | 5 | −1 | −1 | −1 |
|---|---|---|---|---|---|---|---|
| 16 | 1 | 16 | 16 | 1 | 24 | −1 | −1 |
| 6 | 27 | 29 | 4 | 11 | 6 | 4 | −1 |
| 11 | 10 | 0 | 0 | 14 | 16 | 23 | 18 |

The base matrix $Hb^2$ corresponding to the expansion factor 96 is:

| 67 | 81 | 52 | 27 | 16 | −1 | −1 | −1 |
|---|---|---|---|---|---|---|---|
| 50 | 3 | 46 | 49 | 5 | 73 | −1 | −1 |
| 20 | 81 | 89 | 12 | 34 | 18 | 12 | −1 |
| 34 | 31 | 1 | 0 | 43 | 49 | 70 | 56 |

The base matrix $Hb^3$ corresponding to the expansion factor 160 is:

| 113 | 136 | 88 | 45 | 28 | −1 | −1 | −1 |
|---|---|---|---|---|---|---|---|
| 84 | 6 | 81 | 82 | 9 | 123 | −1 | −1 |
| 34 | 135 | 149 | 20 | 57 | 31 | 20 | −1 |
| 57 | 52 | 2 | 0 | 72 | 83 | 118 | 94 |

The base matrix $Hb^4$ corresponding to the expansion factor 256 is:

| 181 | 217 | 142 | 72 | 45 | −1 | −1 | −1 |
|---|---|---|---|---|---|---|---|
| 134 | 11 | 130 | 131 | 14 | 197 | −1 | −1 |
| 55 | 217 | 239 | 32 | 92 | 50 | 32 | −1 |
| 92 | 83 | 4 | 1 | 115 | 133 | 190 | 151 |

The base matrix $Hb^5$ corresponding to the expansion factor 768 is:

| 542 | 652 | 422 | 216 | 134 | −1 | −1 | −1 |
|---|---|---|---|---|---|---|---|
| 403 | 28 | 388 | 393 | 43 | 590 | −1 | −1 |
| 163 | 648 | 715 | 96 | 273 | 148 | 96 | −1 |
| 273 | 249 | 9 | 0 | 345 | 398 | 566 | 451 |

The manner 2 has beneficial effects that the same decoder may be used for a plurality of code lengths with merely a few control circuits to be added. That is, the LDPC code can support very flexible code lengths; and it is ensured that the matrix characteristics of the LDPC code have little change from large expansion factors to small expansion factors, thereby making the LDPC code maintain better decoding performance over a larger range of code lengths.

Similarly, the base matrix of another expansion factor is calculated and obtained in the manner 3 in two steps.

In step 1, a part of the formula in the manner 3 is calculated as follows:

$$h_{ij}'^{v} = \alpha\left\lfloor \frac{h_{ij}^{6}}{\alpha} \right\rfloor$$

where $h_{ij}^{6}$ is an entry in the i-th row and the j-th column of the base matrix $Hb^6$ corresponding to the maximum expansion factor $z_{V_{max}}$=1280 (Vmax=6), α=Pmax/pl, and thus α has 2 values (the value 1 corresponds to the first entry 256 in Pset and the expansion factors {256, 768, 1280}; and the value 8 corresponds to the second entry 32 in Pset and the expansion factors {32, 96, 160}), and v=1, 2, 3, 4, 5.

It can be found that the manner 3 has the same step 1 as the manner 1. The base matrices and $Hb'^1$, $Hb'^2$, $Hb'^3$, $Hb'^4$ and $Hb'^1$, of another expansion factor (less than 1280) are calculated according to step 1 in the manner 3 just the same as step 1 in the manners 1 and 2. Repetition will not be made here.

In step 2, the rest part of the formula in the manner 1 is calculated as follows:

$$h_{ij}^{v} = \text{Round}\left((h_{ij}'^{v}) \times \frac{z_v}{z_{Vmax}}\right)$$

where v=1, 2, 3, 4, 5, $h'^{v}_{ij}$ is an entry in the i-th row and the j-th column of the base matrix $Hb'^{v}$ corresponding to the expansion factor zv, zv has values {32, 96, 160, 256, 768}, and $z_{vmax}$=1280. The other five base matrices corresponding to the expansion factors {32, 96, 160, 256, 768} are respectively calculated according to step 2 as follows:

The base matrix $Hb^1$ corresponding to the expansion factor 32 is:

| 23 | 27 | 18 | 9 | 6 | −1 | −1 | −1 |
|---|---|---|---|---|---|---|---|
| 17 | 1 | 16 | 16 | 2 | 25 | −1 | −1 |
| 7 | 27 | 30 | 4 | 11 | 6 | 4 | −1 |
| 11 | 10 | 0 | 0 | 14 | 17 | 24 | 19 |

The base matrix $Hb^2$ corresponding to the expansion factor 96 is:

| 68 | 82 | 53 | 27 | 17 | −1 | −1 | −1 |
|---|---|---|---|---|---|---|---|
| 50 | 4 | 49 | 49 | 5 | 74 | −1 | −1 |
| 20 | 81 | 89 | 12 | 34 | 19 | 12 | −1 |
| 34 | 31 | 1 | 0 | 43 | 50 | 71 | 56 |

The base matrix $Hb^3$ corresponding to the expansion factor 160 is:

| 113 | 136 | 88 | 45 | 28 | −1 | −1 | −1 |
|---|---|---|---|---|---|---|---|
| 84 | 6 | 81 | 82 | 9 | 123 | −1 | −1 |
| 34 | 135 | 149 | 20 | 57 | 31 | 20 | −1 |
| 57 | 52 | 2 | 0 | 72 | 83 | 118 | 94 |

The base matrix $Hb^4$ corresponding to the expansion factor 256 is:

| 181 | 218 | 142 | 72 | 46 | −1 | −1 | −1 |
|---|---|---|---|---|---|---|---|
| 135 | 11 | 131 | 131 | 15 | 197 | −1 | −1 |
| 55 | 217 | 239 | 32 | 92 | 51 | 32 | −1 |
| 92 | 84 | 5 | 1 | 115 | 133 | 190 | 152 |

The base matrix $Hb^5$ corresponding to the expansion factor 768 is:

| 543 | 653 | 422 | 216 | 134 | −1 | −1 | −1 |
|---|---|---|---|---|---|---|---|
| 403 | 29 | 389 | 394 | 43 | 590 | −1 | −1 |
| 163 | 648 | 715 | 96 | 274 | 149 | 96 | −1 |
| 274 | 250 | 10 | 0 | 346 | 398 | 566 | 451 |

The manner 3 has beneficial effects that the same decoder may be used for a plurality of code lengths with merely a few control circuits to be added. That is, the LDPC code can support very flexible code lengths; and it is ensured that the matrix characteristics of the LDPC code have little change from large expansion factors to small expansion factors, thereby making the LDPC code maintain better decoding performance over a larger range of code lengths.

For specific examples in this embodiment, reference may be made to the examples described in the above embodiments and further embodiments, and repetition will not be made in this embodiment.

Embodiment 9

The LDPC code supports V code lengths, each code length corresponds to a base matrix Hb of the same size of Mb×Nb, and entries corresponding to a non-zero square matrix in the base matrix of each code length have same positions or at most 3 different positions in the basis matrix. The expansion factor Z supports a set of determined expansion factors $\{z_1, z_2, z_3, \ldots, z_{Vmax}\}$, the expansion factor of each code length is one entry in the set of expansion factors, and a value of an entry corresponding to the non-zero square matrix of each code length is calculated based on an entry corresponding to the non-zero square matrix of the maximum code length:

$$h_{ij}^{v} = \alpha\left[\frac{h_{ij}^{Vmax}}{\alpha}\right]$$

where α=Pmax/Pl, v=1, 2, . . . , Vmax, $z_1, z_2, z_3, \ldots, z_{Vmax}$ are arranged in an ascending order, $z_{Vmax}$ is the expansion factor of the maximum code length, $z_v$ is the expansion factor of the v-th code length, $h_{ij}^{Vmax}$ is an entry other than −1 in the i-th row and the j-th column of the maximum code length, and is an entry other than −1 in the i-th row and the j-th column of the v-th code length, mod is a modulo operation, [ ] is a floor operation, and Round is a rounding operation. The expansion factor $z_v$ is n times a positive integer pl, z=pl×n. The positive integer pl is one entry of a subset Pset, the subset Pset is a subset of a set consisting of all positive integer factors of Pmax, n is a natural number, and Pmax is an integer greater than or equal to 4.

A more specific example is given here.

Pset is {10, 20, 40, 80, 120, 240}, that is, Pmax=256, and n has a value of 2. It is known that there are 6 expansion factors, the set of determined expansion factors supported by the expansion factor Z has 6 entries, which means Vmax=6, the set of expansion factors is {20, 40, 80, 160, 240, 480} and a set of code lengths is {100, 200, 400, 800, 1200, 2400}. The maximum expansion factor is $z_{vmax}$=480 and the base matrix $Hb^6$ corresponding to the maximum expansion factor $z_{vmax}$=480 is given:

| | | | | | | | | | |
|---|---|---|---|---|---|---|---|---|---|
| 252 | 391 | 201 | 291 | 387 | 225 | −1 | −1 | −1 | −1 |
| 151 | 243 | 413 | 100 | 412 | 420 | 411 | −1 | −1 | −1 |
| 189 | 234 | 138 | 298 | 34 | 84 | 466 | 430 | −1 | −1 |
| 254 | 120 | 32 | 317 | 206 | 311 | 253 | 212 | 324 | −1 |
| 73 | 359 | 266 | 393 | 163 | 120 | 189 | 437 | 414 | 477 |

The base matrix $Hb^6$ has 5 rows and 10 columns. It is known that the number of rows of the base matrix (or the number of check columns) is Mb=5, the total number of columns of the base matrix is Nb=10, and the number of system columns of the base matrix Kb=Nb−Mb=10−5=5, which means that the submatrix including the first Kb=5 columns of the base matrix is an Mb×Kb block A corresponding to a plurality of systematic bits and the submatrix including the last Mb=5 columns of the base matrix is an Mb×Mb block B corresponding to a plurality of parity bits. The base matrix $Hb^6$ may be described as [A, B]. The base matrices of other code lengths {20, 40, 80, 160, 240} have the same matrix parameters (Kb, Nb, Mb) described above and repetition will not be made here.

The expansion factor of each code lengths in {100, 200, 400, 800, 1200, 2400} is one entry in the set of expansion factors {20, 40, 80, 160, 240, 480}, and the value of the entry corresponding to the non-zero square matrix of each code length is calculated based on the entry corresponding to the non-zero square matrix of the maximum code length 2400:

$$h_{ij}^{v} = \alpha\left[\frac{h_{ij}^{6}}{\alpha}\right]$$

where α=Pmax/Pl, pl is one entry in the subset Pset {10, 20, 40, 80, 120, 240} and has one-to-one correspondence to the set of expansion factors {20, 40, 80, 160, 240, 480}, and the i0-th entry in the set of expansion factors is equal to the i0-th entry in the subset Pset multiplied by n=2, where i0=1, 2, . . . , 6. For any expansion factor in the set of expansion factors {20, 40, 80, 160, 240, 480}, α has values {24, 12, 6, 3, 2, 1}. According to the above formula, the base matrix of the code lengths {100, 200, 400, 800, 1200} (corresponding to the set of expansion factors {20, 40, 80, 160, 240}) is given:

The base matrix $Hb^1$ corresponding to the expansion factor 20 is:

| | | | | | | | | | |
|---|---|---|---|---|---|---|---|---|---|
| 240 | 384 | 192 | 288 | 384 | 216 | −1 | −1 | −1 | −1 |
| 144 | 240 | 408 | 96 | 408 | 408 | 408 | −1 | −1 | −1 |
| 168 | 216 | 120 | 288 | 24 | 72 | 456 | 408 | −1 | −1 |
| 240 | 120 | 24 | 312 | 192 | 288 | 240 | 192 | 312 | −1 |
| 72 | 336 | 264 | 384 | 144 | 120 | 168 | 432 | 408 | 456 |

The base matrix $Hb^2$ corresponding to the expansion factor 40 is:

| | | | | | | | | | |
|---|---|---|---|---|---|---|---|---|---|
| 252 | 384 | 192 | 288 | 384 | 216 | −1 | −1 | −1 | −1 |
| 144 | 240 | 408 | 96 | 408 | 420 | 408 | −1 | −1 | −1 |
| 180 | 228 | 132 | 288 | 24 | 84 | 456 | 420 | −1 | −1 |
| 252 | 120 | 24 | 312 | 204 | 300 | 252 | 204 | 324 | −1 |
| 72 | 348 | 264 | 384 | 156 | 120 | 180 | 432 | 408 | 468 |

The base matrix $Hb^3$ corresponding to the expansion factor 80 is:

| | | | | | | | | | |
|---|---|---|---|---|---|---|---|---|---|
| 252 | 390 | 198 | 288 | 384 | 222 | −1 | −1 | −1 | −1 |
| 150 | 240 | 408 | 96 | 408 | 420 | 408 | −1 | −1 | −1 |
| 186 | 234 | 138 | 294 | 30 | 84 | 462 | 426 | −1 | −1 |
| 252 | 120 | 30 | 312 | 204 | 306 | 252 | 210 | 324 | −1 |
| 72 | 354 | 264 | 390 | 162 | 120 | 186 | 432 | 414 | 474 |

The base matrix $Hb^4$ corresponding to the expansion factor 160 is:

| | | | | | | | | | |
|---|---|---|---|---|---|---|---|---|---|
| 252 | 390 | 201 | 291 | 387 | 225 | −1 | −1 | −1 | −1 |
| 150 | 243 | 411 | 99 | 411 | 420 | 411 | −1 | −1 | −1 |
| 199 | 234 | 138 | 297 | 33 | 84 | 465 | 429 | −1 | −1 |
| 252 | 120 | 30 | 315 | 204 | 309 | 252 | 210 | 234 | −1 |
| 72 | 357 | 264 | 393 | 162 | 120 | 186 | 435 | 414 | 477 |

The base matrix $Hb^5$ corresponding to the expansion factor 240 is:

| | | | | | | | | | |
|---|---|---|---|---|---|---|---|---|---|
| 252 | 390 | 200 | 290 | 386 | 224 | −1 | −1 | −1 | −1 |
| 150 | 242 | 412 | 100 | 412 | 420 | 410 | −1 | −1 | −1 |
| 188 | 234 | 138 | 298 | 34 | 84 | 466 | 430 | −1 | −1 |
| 254 | 120 | 32 | 316 | 206 | 310 | 252 | 212 | 324 | −1 |
| 72 | 358 | 256 | 392 | 162 | 120 | 186 | 436 | 414 | 476 |

Alternatively, at most 3 entries corresponding to the non-zero square matrix are different between all the base matrices described above. For example, we may found that at most 3 entries corresponding to the non-zero square matrix are different between every two base matrices of the 6 base matrices $\{Hb^1, Hb^2\ Hb^3, Hb^4, Hb^5, Hb^6\}$. The beneficial effects that unified characteristics (such as degree distribution) of the base matrix may be maintained between the base matrices and new matrix characteristics may be added ensure that superior performance of the base matrix may be obtained at various code lengths.

The base matrix $Hb^1$ corresponding to the expansion factor 20 is:

| | | | | | | | | | |
|---|---|---|---|---|---|---|---|---|---|
| 240 | 384 | 192 | 288 | 384 | 216 | −1 | −1 | −1 | −1 |
| 144 | −1 | 408 | 96 | 408 | 408 | 408 | −1 | −1 | −1 |
| 168 | 216 | 120 | 288 | 24 | 72 | 456 | 408 | −1 | −1 |
| 240 | 120 | 24 | 312 | 192 | 288 | 240 | 192 | 312 | −1 |
| 72 | 336 | 264 | 284 | 144 | 120 | 168 | 432 | 408 | 456 |

The base matrix $Hb^2$ corresponding to the expansion factor 40 is:

| | | | | | | | | | |
|---|---|---|---|---|---|---|---|---|---|
| 252 | 384 | 192 | 288 | 384 | 216 | −1 | −1 | −1 | −1 |
| 144 | 240 | 408 | 96 | 408 | 420 | 408 | −1 | −1 | −1 |
| 180 | 228 | 132 | 288 | 24 | 84 | 456 | 420 | −1 | −1 |
| 252 | 120 | 24 | 312 | 204 | 300 | 252 | 204 | 324 | −1 |
| 72 | 348 | −1 | 384 | 156 | 120 | 180 | 432 | 408 | 468 |

The base matrix $Hb^3$ corresponding to the expansion factor 80 is:

| | | | | | | | | | |
|---|---|---|---|---|---|---|---|---|---|
| 252 | 390 | 198 | 388 | 384 | 222 | −1 | −1 | −1 | −1 |
| 150 | 240 | 408 | 96 | 408 | 420 | 408 | −1 | −1 | −1 |
| 186 | 234 | 138 | 294 | 30 | 84 | 462 | 426 | −1 | −1 |
| 252 | 120 | 30 | −1 | 204 | 306 | 252 | 210 | 324 | −1 |
| 72 | 354 | 264 | 390 | 162 | 120 | 186 | 432 | 414 | 474 |

The base matrix $Hb^4$ corresponding to the expansion factor 160 is:

| | | | | | | | | | |
|---|---|---|---|---|---|---|---|---|---|
| 252 | 390 | 201 | 291 | 387 | 225 | −1 | −1 | −1 | −1 |
| 150 | 243 | 411 | 99 | 411 | 420 | 411 | −1 | −1 | −1 |
| 189 | 234 | 138 | 297 | 33 | 84 | 465 | 429 | −1 | −1 |

-continued

| | | | | | | | | | |
|---|---|---|---|---|---|---|---|---|---|
| 252 | 120 | 30 | 315 | 204 | −1 | 252 | 210 | 324 | −1 |
| 72 | 357 | 264 | 393 | 162 | 120 | 186 | 435 | 414 | 477 |

The base matrix $Hb^5$ corresponding to the expansion factor 240 is:

| | | | | | | | | | |
|---|---|---|---|---|---|---|---|---|---|
| 252 | 390 | 200 | 290 | 386 | 224 | −1 | −1 | −1 | −1 |
| 150 | 242 | 412 | 100 | 412 | 420 | 410 | −1 | −1 | −1 |
| 186 | 234 | 136 | 298 | 34 | 84 | −1 | 430 | −1 | −1 |
| 254 | 120 | 316 | 206 | 310 | 252 | 212 | 234 | 324 | −1 |
| 72 | 358 | 266 | 392 | 162 | 120 | 186 | 436 | 414 | 476 |

Apparently, those skilled in the art should understand that each of the above-mentioned modules or steps of the present disclosure may be implemented by a general-purpose computing device, the modules or steps may be concentrated on a single computing device or distributed on a network formed by multiple computing devices, the modules or steps may be implemented by program codes executable by the computing devices, so that the modules or steps may be stored in a storage device and executable by the computing devices. In some circumstances, the illustrated or described steps may be executed in sequences different from those described herein, or the modules or steps may be made into various integrated circuit modules separately, or multiple modules or steps therein may be made into a single integrated circuit module for implementation. In this way, the present disclosure is not limited to any specific combination of hardware and software.

The above are only some embodiments of the present disclosure and are not intended to limit the present disclosure, and for those skilled in the art, the present disclosure may have various modifications and variations. Any modifications, equivalent substitutions, improvements and the like made within the spirit and principle of the present disclosure fall within the scope of the present disclosure.

What is claimed is:

1. An encoding method for a structured low-density parity-check (LDPC) code, comprising:

determining a base matrix Hb used for encoding, wherein the base matrix Hb comprises an Mb×Kb block A corresponding to a plurality of systematic bits and an Mb×Mb block B corresponding to a plurality of parity bits to have Hb=[A, B], and $hb_{ij}$ denotes an entry in an i-th row and a j-th column of the base matrix Hb, wherein i is a row index of the base matrix Hb, j is a column index of the base matrix Hb, wherein Kb=Nb−Mb, Kb is an integer greater than or equal to 4 and less than or equal to 10, Nb is an integer, i=1, . . . , Mb and j=1, Nb, and Nb is greater than or equal to 3×Kb;

wherein the base matrix Hb comprises a plurality of submatrices, the plurality of submatrices comprises an upper-left submatrix Hb1 and an upper-left submatrix Hb2, a number of rows of the upper-left submatrix Hb1 and a number of rows of the upper-left submatrix Hb2 both are smaller than a number of rows of the base matrix Hb, a number of columns of the upper-left submatrix Hb1 and a number of columns of the upper-left submatrix Hb2 both are smaller than a number of columns of the base matrix Hb, and the upper-left submatrix Hb1 is an upper-left submatrix of the upper-left submatrix Hb2; and performing an LDPC encoding operation on a source information bit sequence according to the base matrix Hb and an expansion factor Z corresponding to the base matrix Hb to obtain a codeword sequence, wherein Z is a positive integer greater than or equal to 1;

wherein the upper-left submatrix Hb1 consists of an intersection of the first 4 rows and the first Kb+4 columns of the matrix Hb, a number of entries corresponding to a Z×Z non-zero square matrix in each row of the upper-left submatrix Hb1 is less than or equal to Kb+2 and greater than or equal to Kb−2, and a square matrix comprising the last four columns of the upper-left submatrix Hb1 is a lower-left triangular matrix or a quasi-lower-left triangular matrix;

wherein the lower-left triangular matrix refers to a square matrix each entry above the main diagonal of which corresponds to a Z×Z zero square matrix, and each entry on the main diagonal of which corresponds to a Z×Z identity matrix;

wherein the quasi-lower-left triangular matrix refers to a 4×4 square matrix which comprises a L×L upper-right submatrix, wherein the L×L upper-right submatrix is a lower-left triangular matrix, and wherein the L×L upper-right submatrix consists of an intersection of the first L rows and the last L columns of the upper-left submatrix Hb1, L is equal to 2 or 3;

wherein the upper-left submatrix Hb2 consists of an intersection of the first Kb rows and the first 2×Kb columns of the matrix Hb, a number of entries corresponding to the Z×Z non-zero square matrix in each row of a submatrix consisting of an intersection of the last Kb−4 rows and the first Kb columns of the upper-left submatrix Hb2 is less than or equal to Kb−2.

2. The method of claim 1, wherein the source information bit sequence has (Nb−Mb)×Z bits and the codeword sequence has Nb×Z bits.

3. The method of claim 1, wherein each of all entries in a submatrix consisting of an intersection of the first 4 rows and the last Kb−4 columns of the upper-left submatrix Hb2 corresponds to a Z×Z zero square matrix, a submatrix consisting of an intersection of the last Kb−4 rows and the last Kb−4 columns of the upper-left submatrix Hb2 is an (Kb−4)×(Kb−4) lower-left triangular matrix or quasi-lower-left triangular matrix, and each of all entries in a submatrix consisting of an intersection of the last Kb−4 rows and the (Kb+1)-th to (Kb+3)-th columns of the upper-left submatrix Hb2 corresponds to the Z×Z zero square matrix;

when the square matrix comprising the last four columns of the upper-left submatrix Hb1 is a lower triangular matrix, only one entry in the last Kb−4 rows and an (Kb+4)-th column of the upper-left submatrix Hb2 corresponds to the Z×Z non-zero square matrix; and when the square matrix comprising the last four columns of the upper-left submatrix Hb1 is a quasi-lower triangular matrix, each of all entries in the last Kb−4 rows and the (Kb+4)-th column of the upper-left submatrix Hb2 corresponds to the Z×Z zero square matrix.

4. The method of claim 1, wherein the expansion factor Z supports a set of determined values $\{z_1, z_2, z_3, \ldots, z_V\}$, wherein $z_1, z_2, \ldots, z_V$ are arranged in an ascending order, and $z_r, z_s, z_t, z_u$ are four expansion factors in the set of the determined values and satisfy $z_1 \le z_r \le z_s \le z_t \le z_u \le z_V$, wherein V, r, s, t and u are subscripts, $1 \le r \le s \le t \le u \le V$, and V is an integer greater than or equal to 2; and in a case where $z_1 \le Z = z_i < z_r$, for the LDPC code corresponding to the expansion factor $Z=z_i$ and the base matrix Hb, at least one bit of codeword bits having a weight greater than 2 in each LDPC codeword has a girth equal to 4; and for the LDPC code corresponding to the expansion factor $Z=z_i$ and the base matrix Hb with heaviest R columns deleted, all codeword bits having a weight greater than 2 in each LDPC codeword have a girth equal to 6, wherein R is less than or equal to Kb/2;

in a case where $z_r \le Z = z_i < z_s$, for the LDPC code corresponding to the expansion factor $Z=z_i$ and the base matrix Hb, all codeword bits having a weight greater than 2 in each LDPC codeword have a girth equal to 6;

in a case where $z_s \le Z = z_i < z_t$, for the LDPC code corresponding to the expansion factor $Z=z_i$ and the base matrix Hb, all systematic bits having a weight greater than 2 in each LDPC codeword have a girth equal to 6 and at least one parity bit having a weight greater than 2 in each LDPC codeword has a girth greater than or equal to 8;

in a case where $z_t \le Z = z_i < z_u$, for the LDPC code corresponding to the expansion factor $Z=z_i$ and the base matrix Hb, all codeword bits having a weight greater than 2 in each LDPC codeword have a girth equal to 8; and in a case where $z_u \le Z = z_i < z_V$, for the LDPC code corresponding to the expansion factor $Z=z_i$ and the base matrix Hb, all systematic bits having a weight greater than 2 in each LDPC codeword have a girth equal to 8 and at least one parity bit having a weight greater than 2 in each LDPC codeword has a girth greater than or equal to 10;

wherein each codeword bit of one LDPC codeword corresponds to a respective column of a parity check matrix, a weight of the each codeword bit refers to a number of non-zero entries in the respective column of the parity check matrix, and i=1, 2, . . . , V.

5. The method of claim 3, wherein the base matrix Hb further comprises:

an upper-left submatrix Hb3; wherein the upper-left submatrix Hb3 consists of an intersection of the first 2×Kb rows and the first 3×Kb columns of the base matrix Hb, and a submatrix consisting of an intersection of the last Kb rows and the last Kb columns of the upper-left submatrix Hb3 is an Kb×Kb identity matrix;

wherein each entry on the main diagonal of the identity matrix corresponds to a Z×Z identity matrix, and each entry except the main diagonal elements in the identity matrix corresponds to a Z×Z zero square matrix;

each of all entries in a submatrix consisting of an intersection of the first Kb rows and the last Kb columns of the upper-left submatrix Hb3 corresponds to the Z×Z zero square matrix; and the last Kb rows and the (Kb+1)-th to 2×Kb-th columns of the upper-left submatrix Hb3 constitute a submatrix where only one entry in each column of L1 columns corresponds to a non-zero square matrix, and each of all entries in remaining Kb−L1 columns corresponds to the Z×Z zero square matrix, wherein L1 is an integer greater than or equal to 0 and less than Kb.

6. The method of claim 1, wherein different Kb values are used in an enhanced mobile broadband (eMMB) scenario and an ultra-reliable and low-latency communication (URLLC) scenario.

7. The method of claim 1, wherein an encoder uses the matrix Hb for LDPC encoding in an eMMB scenario and the encoder uses another base matrix for the LDPC encoding in an ultra-reliable and low-latency scenario; wherein a set comprising row and column position index pairs (i, j) of each of all entries corresponding to a non-zero square matrix of the another base matrix is a subset of a set comprising row and column position index pairs (i, j) of each of all entries corresponding to the non-zero square matrix of the base matrix Hb.

8. The method of claim 1, wherein in the base matrix Hb, a number of entries corresponding to a Z×Z non-zero square matrix in a g-th row is less than or equal to a number of entries corresponding to the Z×Z non-zero square matrix in a (g+1)-th row; wherein g=1, 2, . . . , Mb−1.

9. The method of claim 1, wherein a number of entries corresponding to a non-zero square matrix in a j-th column of the base matrix Hb is Lj and a first entry from top to bottom is 0; wherein Lj is a positive integer greater than or equal to 1 and j=1, . . . Nb.

10. The method of claim 1, wherein the LDPC code supports V code lengths, each code length corresponds to a base matrix Hb of the same size of Mb×Nb, and entries corresponding to a non-zero square matrix in the base matrix Hb of the each code length have same positions or at most 3 different positions in the basis matrix; and the expansion factor Z supports a set of determined expansion factors $\{z_1, z_2, z_3, \ldots, z_{Vmax}\}$, the expansion factor of the each code length is one entry in the set of expansion factors, and a value of an entry corresponding to the non-zero square matrix of the each code length is calculated based on an entry corresponding to the non-zero square matrix of a maximum code length, $$h_{ij}^{v} = \alpha\left\lfloor\frac{h_{ij}^{Vmax}}{\alpha}\right\rfloor;$$

wherein α=Pmax/pl, v=1, 2, . . . , Vmax, $z_1, z_2, z_3, \ldots, z_{Vmax}$ are arranged in an ascending order, $z_{Vmax}$ is the expansion factor of the maximum code length, $z_v$ is the expansion factor of a v-th code length, $h_{ij}^{Vmax}$ is a non-zero entry in an i-th row and a j-th column of the maximum code length, and $h_{ij}^{v}$ is an entry corresponding the non-zero square matrix in an i-th row and a j-th column of the v-th code length; and Mod is a modulo operation, [ ] is a floor operation, Round is a rounding operation, and the expansion factor $z_v$ is n times a positive integer pl, z=pl×n, wherein the positive integer pl is one entry of a subset Pset, the subset Pset is a subset of a set consisting of all positive integer factors of Pmax, n is a natural number, and Pmax is an integer greater than or equal to 4.

11. A decoding method for a structured low-density parity-check (LDPC) code, comprising:

determining a base matrix Hb used for decoding, wherein the base matrix Hb comprises an Mb×Kb block A corresponding to a plurality of systematic bits and an Mb×Mb block B corresponding to a plurality of parity bits to have Hb=[A, B], and $hb_{ij}$ denotes an entry in an i-th row and a j-th column of the base matrix Hb, wherein i is a row index of the base matrix Hb, j is a column index of the base matrix Hb, wherein Kb=Nb−Mb, Kb is an integer greater than or equal to 4 and less than or equal to 10, Nb is an integer, i=1, . . . , Mb and j=1, Nb, and Nb is greater than or equal to 3×Kb;

wherein the base matrix Hb comprises a plurality of submatrices, the plurality of submatrices comprises an upper-left submatrix Hb1 and an upper-left submatrix Hb2, a number of rows of the upper-left submatrix Hb1 and a number of rows of the upper-left submatrix Hb2 both are smaller than a number of rows of the base matrix Hb, a numbers of columns of the upper-left submatrix Hb1 and a number of columns of the upper-left submatrix Hb2 both are smaller than a number of columns of the base matrix Hb, and the upper-left submatrix Hb1 is an upper-left submatrix of the upper-left submatrix Hb2; and performing a decoding operation on a codeword of a preset number of bits according to the base matrix Hb and an expansion factor Z corresponding to the base matrix Hb to obtain a source information bit sequence, wherein Z is a positive integer greater than or equal to 1;

wherein the upper-left submatrix Hb1 consists of an intersection of the first 4 rows and the first Kb+4 columns of the matrix Hb, a number of entries corresponding to a Z×Z non-zero square matrix in each row of the upper-left submatrix Hb1 is less than or equal to Kb+2 and greater than or equal to Kb−2, and a square matrix comprising the last four columns of the upper-left submatrix Hb1 is a lower-left triangular matrix or a quasi-lower-left triangular matrix;

wherein the lower-left triangular matrix refers to a square matrix each entry above the main diagonal of which corresponds to a Z×Z zero square matrix, and each entry on the main diagonal of which corresponds to a Z×Z identity matrix;

wherein the quasi-lower-left triangular matrix refers to a 4×4 square matrix which comprises a L×L upper-right submatrix, wherein the L×L upper-right submatrix is a lower-left triangular matrix, and wherein the L×L upper-right submatrix consists of an intersection of the first L rows and the last L columns of the upper-left submatrix Hb1, L is equal to 2 or 3;

wherein the upper-left submatrix Hb2 consists of an intersection of the first Kb rows and the first 2×Kb columns of the matrix Hb, a number of entries corresponding to the Z×Z non-zero square matrix in each row of a submatrix consisting of an intersection of the last Kb−4 rows and the first Kb columns of the upper-left submatrix Hb2 is less than Kb−2.

12. A communication device, comprising: a memory and an encoder; wherein the memory is configured to store a base matrix Hb for encoding and a source information bit sequence, wherein the base matrix Hb comprises an Mb×Kb block A corresponding to a plurality of systematic bits and an Mb×Mb block B corresponding to a plurality of parity bits to have Hb=[A, B], and $hb_{ij}$ denotes an entry in an i-th row and a j-th column of the base matrix Hb, wherein i is a row index of the base matrix Hb, j is a column index of the base matrix, wherein Kb=Nb−Mb, Kb is an integer greater than or equal to 4 and less than or equal to 10, Nb is an integer, i=1, . . . , Mb and j=1, Nb, and Nb is greater than or equal to 3×Kb;

wherein the base matrix Hb comprises a plurality of submatrices, the plurality of submatrices comprise an upper-left submatrix Hb1 and an upper-left submatrix Hb2, a number of rows of the upper-left submatrix Hb1 and a number of rows of the upper-left submatrix Hb2 both are smaller than a number of rows of the base matrix Hb, a numbers of columns of the upper-left submatrix Hb1 and a number of columns of the upper-left submatrix Hb2 both are smaller than a number of columns of the base matrix Hb, and the upper-left submatrix Hb1 is an upper-left submatrix of the upper-left submatrix Hb2;

the encoder is configured to:

determine the base matrix Hb used for encoding; and determine the base matrix Hb and an expansion factor Z corresponding to the base matrix Hb and perform an LDPC encoding operation on the source information bit sequence to obtain a codeword sequence, wherein Z is a positive integer greater than or equal to 1;

wherein the upper-left submatrix Hb1 consists of an intersection of the first 4 rows and the first Kb+4 columns of the matrix Hb, a number of entries corresponding to a Z×Z non-zero square matrix in each row of the upper-left submatrix Hb1 is less than or equal to Kb+2 and greater than or equal to Kb−2, and a square matrix comprising the last four columns of the upper-left submatrix Hb1 is a lower-left triangular matrix or a quasi-lower-left triangular matrix;

wherein the lower-left triangular matrix refers to a square matrix each entry above the main diagonal of which corresponds to a Z×Z zero square matrix, and each entry on the main diagonal of which corresponds to a Z×Z identity matrix;

wherein the quasi-lower-left triangular matrix refers to a 4×4 square matrix which comprises a L×L upper-right submatrix, wherein the L×L upper-right submatrix is a lower-left triangular matrix, and wherein the L×L upper-right submatrix consists of an intersection of the first L rows and the last L columns of the upper-left submatrix Hb1, L is equal to 2 or 3;

wherein the upper-left submatrix Hb2 consists of an intersection of the first Kb rows and the first 2×Kb columns of the matrix Hb, a number of entries corresponding to the Z×Z non-zero square matrix in each row of a submatrix consisting of an intersection of the last Kb−4 rows and the first Kb columns of the upper-left submatrix Hb2 is less than Kb−2.

13. The communication device of claim 12, wherein the source information bit sequence has (Nb−Mb)×Z bits and the codeword sequence has Nb×Z bits.

14. The communication device of claim 12, wherein each of all entries in a submatrix consisting of an intersection of the first 4 rows and the last Kb−4 columns of the upper-left submatrix Hb2 corresponds to a Z×Z zero square matrix, a submatrix consisting of an intersection of the last Kb−4 rows and the last Kb−4 columns of the upper-left submatrix Hb2 is an (Kb−4)×(Kb−4) lower-left triangular matrix or quasi-lower-left triangular matrix, and each of all entries in a submatrix consisting of an intersection of the last Kb−4 rows and the (Kb+1)-th to (Kb+3)-th columns of the upper-left submatrix Hb2 corresponds to the Z×Z zero square matrix;

when the square matrix comprising the last four columns of the upper-left submatrix Hb1 is a lower triangular matrix, only one entry in the last Kb−4 rows and an (Kb+4)-th column of the upper-left submatrix Hb2 corresponds to the Z×Z non-zero square matrix; and when the square matrix comprising the last four columns of the upper-left submatrix Hb1 is a quasi-lower triangular matrix, each of all entries in the last Kb−4 rows and the (Kb+4)-th column of the upper-left submatrix Hb2 corresponds to the Z×Z zero square matrix.

15. The communication device of claim 12, wherein the expansion factor Z supports a set of determined values $\{z_1, z_2, z_3, \ldots z_V\}$, wherein $z_1, z_2, \ldots, z_V$ are arranged in an ascending order, and $z_r$, $z_s$, $z_t$, $z_u$ are four expansion factors in the set of the determined values and satisfy $z_1 \le z_r \le z_s \le z_t \le z_u \le z_V$, wherein V, r, s, t and u are subscripts, $1 \le r \le s \le t \le u \le V$, and V is an integer greater than or equal to 2; and in a case where $z_1 \le Z = z_i < z_r$, for the LDPC code corresponding to the expansion factor $Z = z_i$ and the base matrix Hb, at least one bit of codeword bits having a weight greater than 2 in each LDPC codeword has a girth equal to 4; and for the LDPC code corresponding to the expansion factor $Z = z_i$ and the base matrix Hb with heaviest R columns deleted, all codeword bits having a weight greater than 2 in each LDPC codeword have a girth equal to 6, wherein R is less than or equal to Kb/2;

in a case where $z_r \le Z = z_i < z_s$, for the LDPC code corresponding to the expansion factor $Z = z_i$ and the base matrix Hb, all codeword bits having a weight greater than 2 in each LDPC codeword have a girth equal to 6;

in a case where $z_s \le Z = z_i < z_t$, for the LDPC code corresponding to the expansion factor $Z = z_i$ and the base matrix Hb, all systematic bits having a weight greater than 2 in each LDPC codeword have a girth equal to 6 and at least one parity bit having a weight greater than 2 in each LDPC codeword has a girth greater than or equal to 8;

in a case where $z_t \le Z = z_i < z_u$, for the LDPC code corresponding to the expansion factor $Z = z_i$ and the base matrix Hb, all codeword bits having a weight greater than 2 in each LDPC codeword have a girth equal to 8; and in a case where $z_u \le Z = z_i < z_V$, for the LDPC code corresponding to the expansion factor $Z = z_i$ and the base matrix Hb, all systematic bits having a weight greater than 2 in each LDPC codeword have a girth equal to 8 and at least one parity bit having a weight greater than 2 in each LDPC codeword has a girth greater than or equal to 10;

wherein each codeword bit of one LDPC codeword corresponds to a respective column of a parity check matrix, a weight of the each codeword bit refers to a number of non-zero entries in the respective column of the parity check matrix, and $i=1, 2, \ldots, V$.

16. The communication device of claim 12, wherein the LDPC code supports V code lengths, each code length corresponds to a base matrix Hb of the same size of Mb×Nb, and entries corresponding to a non-zero square matrix in the base matrix Hb of the each code length have same positions or at most 3 different positions in the basis matrix; and the expansion factor Z supports a set of determined expansion factors $\{z_1, z_2, z_3, \ldots, z_{Vmax}\}$, the expansion factor of the each code length is one entry in the set of expansion factors, and a value of an entry corresponding to the non-zero square matrix of the each code length is calculated based on an entry corresponding to the non-zero square matrix of a maximum code length, $$h_{ij}^{v} = \alpha\left[\frac{h_{ij}^{Vmax}}{\alpha}\right];$$

wherein $\alpha$=Pmax/pl, v=1, 2, . . . Vmax, $z_1$, $z_2$, $z_3$, . . . , $z_{Vmax}$ are arranged in an ascending order, $z_{Vmax}$ is the expansion factor of the maximum code length, $z_v$ is the expansion factor of a v-th code length, $h_{ij}^{Vmax}$ is a non-zero entry in an i-th row and a j-th column of the maximum code length, and $h_{ij}^{v}$ is an entry corresponding the non-zero square matrix in an i-th row and a j-th column of the v-th code length; and Mod is a modulo operation, [ ] is a floor operation, Round is a rounding operation, and the expansion factor $z_v$ is n times a positive integer pl, z=pl×n, wherein the positive integer pl is one entry of a subset Pset, the subset Pset is a subset of a set consisting of all positive integer factors of Pmax, n is a natural number, and Pmax is an integer greater than or equal to 4.

17. The communication device of claim 14, wherein the base matrix Hb further comprises:

an upper-left submatrix Hb3; wherein the upper-left submatrix Hb3 consists of an intersection of the first 2×Kb rows and the first 3×Kb columns of the base matrix Hb, and a submatrix consisting of an intersection of the last Kb rows and the last Kb columns of the upper-left submatrix Hb3 is an Kb×Kb identity matrix;

wherein each entry on the main diagonal of the identity matrix corresponds to a Z×Z identity matrix, and each entry except the main diagonal elements in the identity matrix corresponds to a Z×Z zero square matrix;

each of all entries in a submatrix consisting of an intersection of the first Kb rows and the last Kb columns of the upper-left submatrix Hb3 corresponds to the Z×Z zero square matrix; and the last Kb rows and the (Kb+1)-th to 2×Kb-th columns of the upper-left submatrix Hb3 constitute a submatrix where only one entry in each column of L1 columns corresponds to a non-zero square matrix, and each of all entries in remaining Kb−L1 columns corresponds to the Z×Z zero square matrix, wherein L1 is an integer greater than or equal to 0 and less than Kb.

18. A communication device, comprising: a memory and a decoder; wherein the memory is configured to store a base matrix Hb for decoding and a codeword of a preset number of bits, wherein the base matrix Hb comprises an Mb×Kb block A corresponding to a plurality of systematic bits and an Mb×Mb block B corresponding to a plurality of parity bits to have Hb=[A, B], and $hb_{ij}$ denotes an entry in an i-th row and a j-th column of the base matrix Hb, wherein i is a row index of the base matrix Hb, j is a column index of the base matrix Hb, wherein Kb=Nb−Mb, Nb is an integer, Kb is an integer greater than or equal to 4 and less than or equal to 10, i=1, . . . , Mb and j=1, . . . Nb, and Nb is greater than or equal to 3×Kb;

wherein the base matrix Hb comprises at least one submatrix, the at least one submatrix comprises an upper-left submatrix Hb1 and an upper-left submatrix Hb2, a number of rows of the upper-left submatrix Hb1 and a number of rows of the upper-left submatrix Hb2 both are smaller than a number of rows of the base matrix Hb, a numbers of columns of the upper-left submatrix Hb1 and a number of columns of the upper-left submatrix Hb2 both are smaller than a number of columns of the base matrix Hb, and the upper-left submatrix Hb1 is an upper-left submatrix of the upper-left submatrix Hb2;

the decoder is configured to perform a decoding operation on a codeword of a preset number of bits according to the base matrix Hb and an expansion factor Z corresponding to the base matrix Hb to obtain a source information bit sequence, wherein Z is a positive integer greater than or equal to 1;

wherein the upper-left submatrix Hb1 consists of an intersection of the first 4 rows and the first Kb+4 columns of the matrix Hb, a number of entries corresponding to a Z×Z non-zero square matrix in each row of the upper-left submatrix Hb1 is less than or equal to Kb+2 and greater than or equal to Kb−2, and a square matrix comprising the last four columns of the upper-left submatrix Hb1 is a lower-left triangular matrix or a quasi-lower-left triangular matrix;

wherein the lower-left triangular matrix refers to a square matrix each entry above the main diagonal of which corresponds to a Z×Z zero square matrix, and each entry on the main diagonal of which corresponds to a Z×Z identity matrix;

wherein the quasi-lower-left triangular matrix refers to a 4×4 square matrix which comprises a L×L upper-right submatrix, wherein the L×L upper-right submatrix is a lower-left triangular matrix, and wherein the L×L upper-right submatrix consists of an intersection of the first L rows and the last L columns of the upper-left submatrix Hb1, L is equal to 2 or 3;

wherein the upper-left submatrix Hb2 consists of an intersection of the first Kb rows and the first 2×Kb columns of the matrix Hb, a number of entries corresponding to the Z×Z non-zero square matrix in each row of a submatrix consisting of an intersection of the last Kb−4 rows and the first Kb columns of the upper-left submatrix Hb2 is less than Kb−2.

* * * * *